(12) United States Patent
Takemura et al.

(10) Patent No.: US 8,697,342 B2
(45) Date of Patent: Apr. 15, 2014

(54) METHOD OF MODIFYING CHEMICALLY AMPLIFIED RESIST PATTERN, MODIFIER FOR CHEMICALLY AMPLIFIED RESIST PATTERN, AND RESIST PATTERN STRUCTURE

(75) Inventors: Ichiro Takemura, Kanagawa (JP); Isao Mita, Kumamoto (JP); Eriko Matsui, Tokyo (JP); Nobuyuki Matsuzawa, Tokyo (JP)

(73) Assignee: Sony Corporation, Tokyo (JP)

( * ) Notice: Subject to any disclaimer, the term of this patent is extended or adjusted under 35 U.S.C. 154(b) by 133 days.

(21) Appl. No.: 13/064,130

(22) Filed: Mar. 8, 2011

(65) Prior Publication Data

US 2011/0244197 A1 Oct. 6, 2011

(30) Foreign Application Priority Data

Mar. 30, 2010 (JP) .................. 2010-077731

(51) Int. Cl.
G03F 7/26 (2006.01)
(52) U.S. Cl.
USPC ............ 430/315; 430/330; 430/328; 430/394
(58) Field of Classification Search
USPC .................. 430/328, 324, 322, 330, 394, 315
See application file for complete search history.

(56) References Cited

U.S. PATENT DOCUMENTS

| | | | | |
|---|---|---|---|---|
| 6,074,800 A * | 6/2000 | Breyta et al. | ............... | 430/270.1 |
| 6,887,646 B1 * | 5/2005 | Fujiwara et al. | ........... | 430/270.1 |
| 2003/0068585 A1 * | 4/2003 | Rottstegge | ..................... | 430/324 |
| 2005/0175926 A1 * | 8/2005 | Sugeta et al. | .............. | 430/270.1 |
| 2006/0114530 A1 * | 6/2006 | Morwald et al. | .................. | 359/2 |
| 2006/0228895 A1 * | 10/2006 | Chae et al. | ..................... | 438/725 |
| 2008/0044759 A1 * | 2/2008 | Ishibashi et al. | ........... | 430/270.1 |
| 2009/0274980 A1 * | 11/2009 | Kang et al. | ..................... | 430/311 |
| 2010/0035177 A1 | 2/2010 | Ishikawa et al. | | |

FOREIGN PATENT DOCUMENTS

| | | |
|---|---|---|
| JP | 2004-079072 | 3/2004 |
| JP | 2008-083587 | 4/2008 |

OTHER PUBLICATIONS

H. Hisamoto et al., "Integrated Chemistry—"Oder-Shift" Revolution in Chemical Technology," Chemistry and Chemical Industry, 2001 54(5), pp. 564-568.

* cited by examiner

*Primary Examiner* — Cynthia Kelly
*Assistant Examiner* — Caleen Sullivan
(74) *Attorney, Agent, or Firm* — Rader, Fishman & Grauer PLLC

(57) ABSTRACT

Disclose herein is a method of modifying a positive-type chemically amplified resist pattern, including the steps of, applying to a surface of a resist pattern, an aqueous solution of a modifier for the positive-type chemically amplified resist pattern, the aqueous solution containing a water-soluble cross-linking agent and a penetration accelerator, the cross-linking agent and the penetration accelerator being dissolved in water or a mixed solvent containing water as a main ingredient, so as to permit the cross-linking agent to penetrate the resist pattern, removing a surplus of the cross-linking agent, and irradiating the resist pattern.

15 Claims, 18 Drawing Sheets

AQUEOUS MODIFIER SOLUTION WITH HIGH CONCENTRATION

REGION WHERE AQUEOUS MODIFIER SOLUTION IS NOT APPLIED

AQUEOUS MODIFIER SOLUTION WITH LOW CONCENTRATION

AQUEOUS MODIFIER SOLUTION WITH HIGH CONCENTRATION

AQUEOUS MODIFIER SOLUTION WITH LOW CONCENTRATION

FIG.5A EXAMPLE 1-1 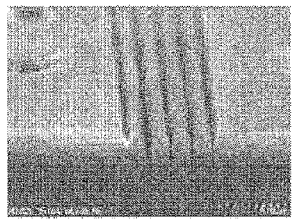
FIG.5B EXAMPLE 1-2 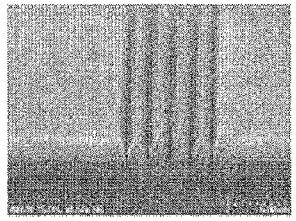
FIG.5C EXAMPLE 1-3 
FIG.5D EXAMPLE 1-4 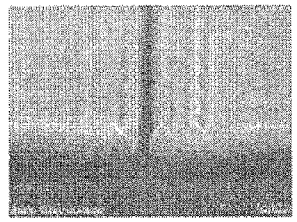
FIG.5E EXAMPLE 1-5 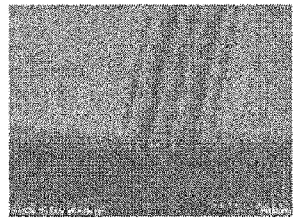
FIG.5F EXAMPLE 1-6 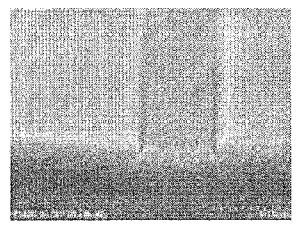
PROPORTION OF PVA IS HIGH
RATE OF INCREASE IN LINE WIDTH, LOW
SHAPE RETENTION CHARACTERISTIC, GOOD
RATE OF INCREASE IN LINE WIDTH, HIGH
DEFORMATION OR ELUTION OBSERVED
PROPORTIONS OF HEXAKIS (METHOXYMETHYL)MELAMINE AND ETHANOL ARE HIGH FIG.6
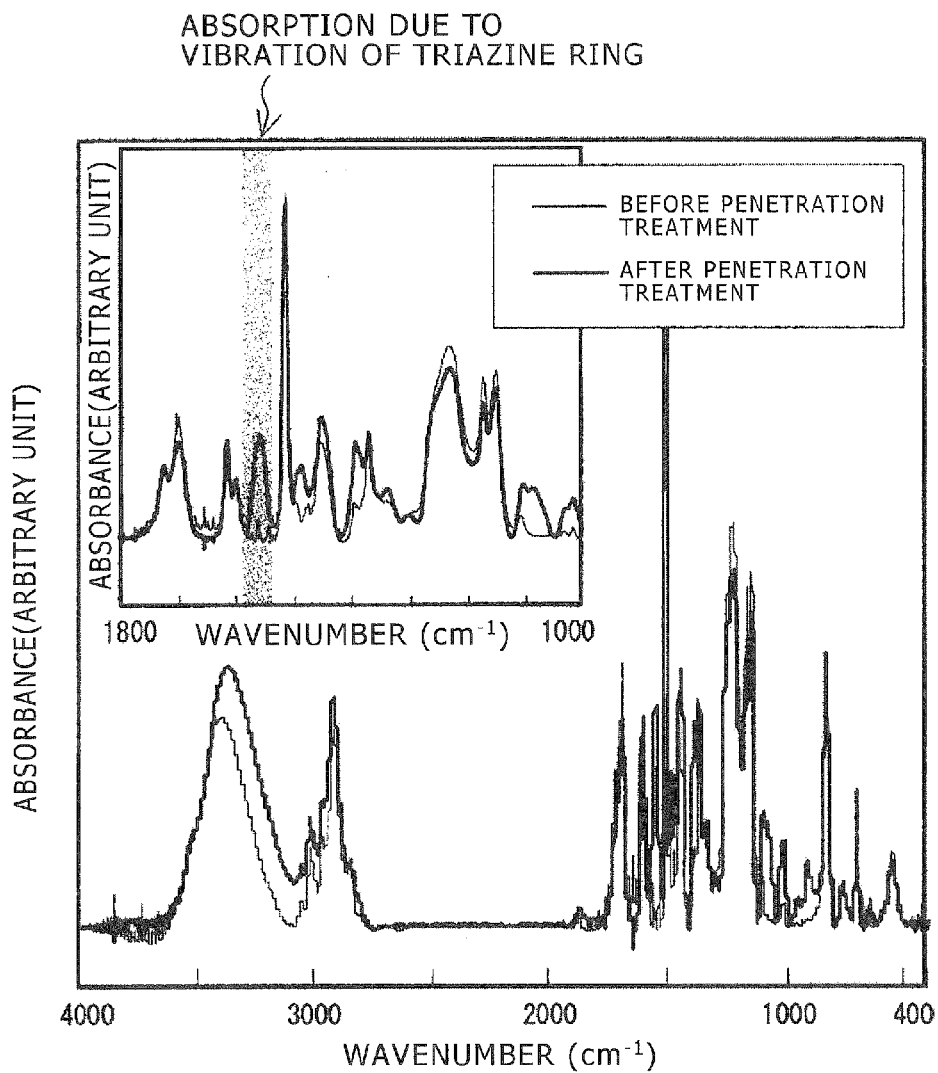
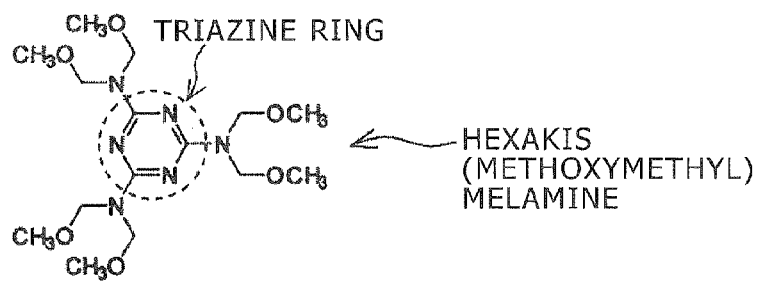

FIG.12A

UNTREATED
RESIST PATTERN

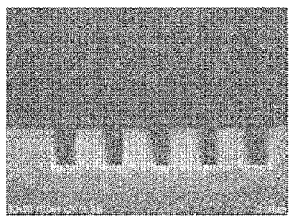

⇩ APPLICATION OF AQUEOUS
MODIFITER SOLUTION

FIG.12B

RESIST PATTERN
WITH AQUEOUS
MODIFIER SOLUTION
APPLIED THERETO

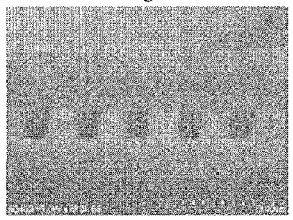

⇩ WASHING WITH WATER

FIG.12C

RESIST PATTERN
PENETRATED BY
CROSS-LINKING AGENT

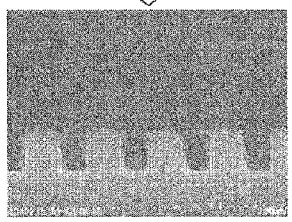

⇩ IRRADIATION WITH UV
LIGHT, FOLLOWED BY HEATING

FIG.12D

MODIFIED RESIST
PATTERN AFTER
HARDENING TREATMENT

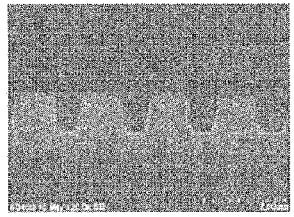

⇩ IMMERSION IN SOLVENT

FIG.12E

MODIFIED RESIST
PATTERN DURING
SOLVENT RESISITANCE
TEST

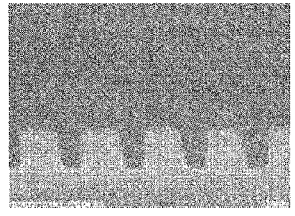

BEFORE SOLVENT RESISITANCE TEST (AFTER CROSS-LINKING AGENT PENETRATION TREATMENT)
AFTER SOLVENT RESISTANCE TEST
FIG.13A
EXAMPLE 4-1
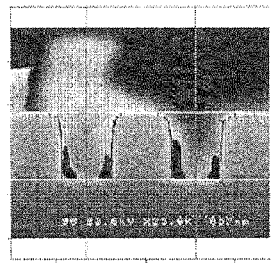 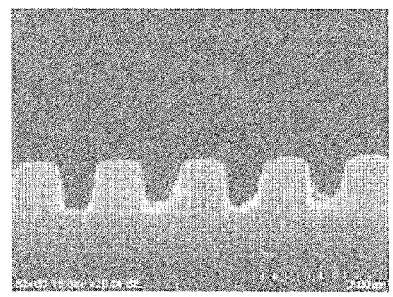
FIG.13B
EXAMPLE 4-2
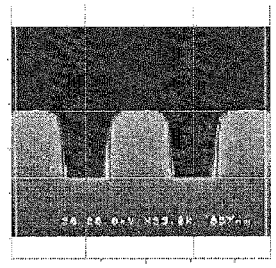 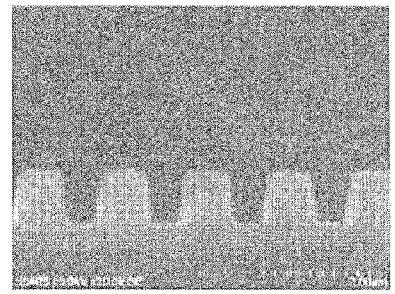
FIG.13C
EXAMPLE 4-3
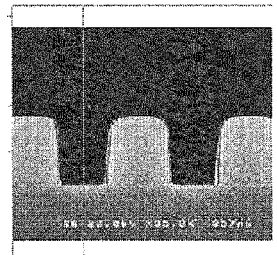 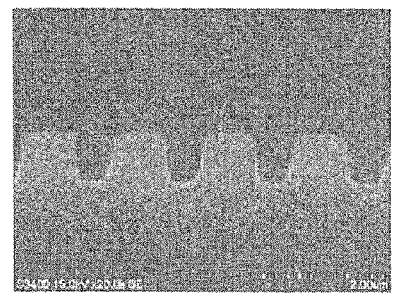

METHOD OF MODIFYING CHEMICALLY AMPLIFIED RESIST PATTERN, MODIFIER FOR CHEMICALLY AMPLIFIED RESIST PATTERN, AND RESIST PATTERN STRUCTURE

BACKGROUND OF THE INVENTION

1. Field of the Invention

The present invention relates to a method of modifying a chemically amplified resist pattern for enhancing solvent resistance, resistance to exposure and development, or the like of a positive-type chemically amplified resist pattern, a modifier for a chemically amplified resist pattern to be used in the modifying method, and a resist pattern structure modified by the modifying method.

2. Description of the Related Art

The technologies central to fine processing process in manufacture of semiconductor integrated circuits and the like include photolithography and etching. In these technologies, first, a mask is produced which has a light blocking pattern corresponding to a pattern to be formed on a substrate, such as a circuit pattern. Then, by utilizing a precise photographic technology, the pattern drawn in the mask is transferred onto the substrate, whereby fine semiconductor devices, electrodes, wiring, etc. are fabricated with high productivity.

In practicing the photolithography, a functional material layer to be processed based on the pattern drawn in the mask is preliminarily formed in a film forming process precedent to the photolithography. The functional material layer is a layer of a material which, when processed, becomes a functional layer constituting the semiconductor devices, electrodes, wiring or the like. The functional material layer may be a semiconductor layer or insulator layer which is formed in a surface layer part of the substrate, or may be a conductive layer or semiconductor layer or insulator layer formed on the substrate in a laminated or stacked manner. Then, first, a photoresist layer (photosensitive material layer) is formed on the functional material layer. The photoresist, which commonly is composed of a photosensitive agent and a resin component or the like, is used in the form of a coating liquid prepared by dissolving or dispersing the ingredients thereof in an organic solvent. After the coating liquid is applied to the substrate by a coating method or the like, the solvent is evaporated off, to form the photoresist layer.

Next, using an exposure apparatus, the photoresist layer is selectively exposed to light through the mask, to form a latent image in the photoresist layer. Thereafter, unrequired portions of the photoresist layer are removed by development to make the latent image visible, whereby a photoresist layer patterned into a shape corresponding to the aperture pattern of the mask, that is, a resist pattern is obtained.

Subsequently, the functional material layer is etched using the resist pattern as a mask, whereby the functional material layer is patterned into the shape of the circuit pattern or the like, for forming the semiconductor devices, electrodes, wiring or the like.

Photoresists (photosensitive materials) are classified into two types, namely, the negative type and the positive type. In the negative type, the portions of the photoresist exposed to light are hardened through polymerization, so that by development the unexposed portions of the photoresist are dissolved away, leaving the exposed portions as a resist pattern. In the negative type, the resist pattern to be left may be swelled with the developing solution, leading to a lowering in resolution. In the positive type, on the other hand, portions of the photoresist exposed to light are depolymerized or changed into a structure soluble in the developing solution, so that by development the exposed portions of the photoresist are dissolved away, leaving the unexposed portions as a resist pattern. The positive type promises a high resolution. Therefore, for applications where high resolution is demanded, positive-type photoresists are used.

Meanwhile, the performances required of semiconductor apparatuses are being enhanced year by year, in terms of operating speed, the number of functions and the lowness of power consumption. To meet these requirements, the circuit patterns of semiconductor integrated circuits are continuously becoming finer. A stepper is used as an exposure apparatus at present. In addition, since the resolution of patterns which can be formed by exposure to light is restricted by the wavelength of the light used, the wavelength of the exposure light is becoming shorter and shorter.

Correspondingly to this trend, photoresists are required to have a sufficient sensitivity for exposure light of which the wavelength is becoming shorter, and to have a high resolution promising reproduction of fine patterns. In recent years, as photoresists having a sufficient sensitivity to short-wavelength light and capable of achieving a high resolution, chemically amplified resists have been used. A chemically amplified resist contains a photo acid generator (PAG) which generates an acid (hydrogen ion $H^+$) when exposed to light, and a resin component the solubility of which is changed by the action of the acid.

FIGS. 14A to 14D illustrate examples of a component of a positive-type chemically amplified resist and a reaction thereof. Triphenylsulfonium trifluoromethanesulfonate shown in FIG. 14A is a photo acid generator which generates an acid (hydrogen ion $H^+$) when exposed to light. On the other hand, polyhydroxystyrene derivative shown in FIG. 14B, hydroxystyrene-acrlyic acid copolymer derivative shown in FIG. 14C, hydroxystyrene-methacrylic acid copolymer derivative (not shown) [hereafter, acrylic acid and methacrylic acid together are abridged to (meth)acrylic acid], poly (meth)acrylic acid derivative (not shown) and the like are resin components each having a solubility which is changed by the action of an acid. Each of these resin components, in the state shown in the figure, has protecting groups bonded to part of acidic groups thereof and, therefore, is insoluble in alkaline developing solutions. However, the protecting groups are acid-detachable. Therefore, when hydrogen ions $H^+$ are supplied from the photo acid generator, the linkage between the acidic group and the protecting group is hydrolyzed as shown in FIG. 14D. As a result, the acidic groups are regenerated. Accordingly, the above-mentioned resin components become soluble in alkaline developing solutions such as an aqueous solution of tetramethylammonium hydroxide (TMAH).

In the hydrolytic reaction shown in FIG. 14D, the hydrogen ion $H^+$ functions as a catalyst and, therefore, the hydrogen ion is not lost in this reaction. Accordingly, one hydrogen ion generated from the photo acid generator exposed to light acts on the resin component repeatedly while diffusing, whereby the hydrolytic reaction is inducted many times. Thus, the chemically amplified resist is a resist having a mechanism in which one-time photoreaction is amplified by a multiplicity of runs of the acid-catalyzed reaction, which promises a very high sensitivity. Therefore, the amount of the photo acid generator (photosensitive agent) is required only to be sufficient for generating a catalytic amount of hydrogen ions. This makes it possible to enhance the transparency of the resist. As a result, the use of a chemically amplified resist makes it possible to form a resist pattern with a high aspect ratio. In the chemically amplified resist, the hydrolytic reaction by the acid catalyst is brought about while diffusing the hydrogen ions in the post exposure bake (PEB) step, and, therefore, temperature control and acid diffusion control in the PEB step is important.

In addition, recently, as a new lithography technology, there has been proposed a double patterning method in which formation and patterning of a photoresist layer are carried out two or more times.

FIGS. 15A to 15H are sectional views for illustrating an example of the double patterning method introduced in Japanese Patent Laid-open No. 2008-83537 (pp. 23, 24, 26 to 28, and 31 to 33; FIGS. 1 and 2) (hereinafter referred to as Patent Document 1). In this method, first, as shown in FIG. 15A, a functional material layer 102 to be patterned, a hard mask layer 103, and a resist layer 104 are formed over a substrate 101 in a laminated or stacked manner. Next, the resist layer 104 is selectively exposed to light through a mask 121, followed by development, whereby a resist pattern 106 having a plurality of trenches (width: d/4) 105 arranged at a pitch d is formed, as shown in FIG. 15B. Subsequently, the hard mask layer 103 is etched using the resist pattern 106 as a mask, followed by removing the remaining resist pattern 106. Consequently, a hard mask pattern 108a formed with a plurality of trenches (width: d/4) 107 is obtained, as shown in FIG. 15C.

Next, as shown in FIG. 15D, a resist layer 109 is formed on the hard mask pattern 108a in the manner of filling up the trenches 107. Subsequently, using a mask 122 positionally shifted by d/2 as compared with the mask 121, a second trench pattern formation is conducted in the same manner as above-mentioned. Specifically, the resist layer 109 is selectively exposed to light through the mask 122, followed by development, whereby a resist pattern 111 having a plurality of trenches (width: d/4) 110 arranged at a pitch d is formed, as shown in FIG. 15E. Next, the hard mask pattern 108a is etched using the resist pattern 111 as a mask, followed by removing the remaining resist pattern 111. As a result of the second trench pattern formation, there is obtained a hard mask pattern 108b in which a plurality of trenches (width: d/4) 107 and 112 are arranged at a pitch d/2 equal to one half of the pitch in the mask 121 used, as shown in FIG. 15F.

Subsequently, as shown in FIG. 15G, the functional material layer 102 is etched using the hard mask pattern 108b as a mask, to form a functional layer 113. Thereafter, the remaining hard mask pattern 108b is removed, as shown in FIG. 15H.

As above-mentioned, according to the double patterning method, a pattern with a pitch smaller than that obtainable by the single patterning method can be formed while using the same exposure apparatus and the same resist composition as used in the single patterning method. In the double patterning method according to the related art, however, it is normally necessary to provide the hard mask layer 103 and the like over the substrate. Besides, in order to pattern the functional material layer 102, the formation and patterning of a resist layer should be carried out at least twice and etching of the hard mask layer 103 should be carried out at least twice; thus, the number of steps to be conducted is large.

In order to easily carry out the double patterning, the pattern obtained upon the first pattern formation (in the above-mentioned example, the resist pattern 106) should have such a solvent resistance as not to be eluted or deformed by the solvent of the resist coating liquid used in the second pattern formation and should have such a resistance to exposure and development as not to be eluted or deformed by the second exposure and development. However, ordinary resist patterns cannot satisfy these conditions. Therefore, before proceeding to the second pattern formation, the pattern obtained by the first pattern formation should be transferred to a layer which is high in solvent resistance and in resistance to exposure and development (in the above-mentioned example, the hard mask layer 103). This is why the number of steps in the double patterning method according to the related art is large.

In view of this problem, Patent Document 1 proposes a novel pattern forming method in which a coating film is formed on a resist pattern obtained by pattern formation so as to protect the resist pattern, whereby the number of steps in the double patterning method can be reduced.

FIGS. 16A to 16F are sectional views showing the pattern forming method proposed in Patent Document 1. Patent Document 1 contains the following description.

In this method, first, as shown in FIG. 16A, a first resist layer 202 composed of a positive-type first chemically amplified resin composition is formed on a support 201. Next, the first resist layer 202 is selectively exposed to light through a mask 221, followed by development, to form a first resist pattern 204 having a plurality of line patterns (width: d/4) 203, as shown in FIG. 16B.

Subsequently, as shown in FIG. 16C, a coating film forming aqueous solution 205 containing a water-soluble resin and a water-soluble cross-linking agent is applied to the surface of the first resist pattern 204 by a dipping method or a coating method or the like. The water-soluble resin may be any resin that is soluble in water at room temperature. The water-soluble resin is preferably one selected from the group including acrylic resins, vinyl resins, cellulose resins, and amide resins. Among these resins, preferred are vinyl resins, and particularly preferred are polyvinyl pyrrolidone and polyvinyl alcohol. The water-soluble cross-linking agent is an organic compound having at least one nitrogen atom in its structure. The organic compound is preferably a nitrogen-containing compound having an amino group and/or an imino group in which at least two hydrogen atoms have been replaced by a hydroxyalkyl group and/or an alkoxyalkyl group. Among these nitrogen-containing compounds, preferred from the viewpoint of cross-linking reactivity is at least one selected from the group including triazine derivatives such as benzoguanamine derivatives, guanamine derivatives, melamine derivatives, etc., glycoluril derivatives and urea derivatives having an amino group or imino group in which at least two hydrogen atoms have been replaced by a methylol group or a lower alkoxymethyl group or both of them.

After the coating film forming aqueous solution 205 is applied, the coating film is subjected to a heating treatment. This accelerates the diffusion of the acid (hydrogen ions) from the first resist pattern 204, and a cross-linking reaction of the water-soluble resin and the water-soluble cross-linking agent accelerated catalytically by the hydrogen ion takes place at the interface between the resist pattern 204 and the coating film forming aqueous solution 205. By the cross-linking reaction, a coating film 206 is formed on the surface of the first resist pattern 204, as shown in FIG. 16C. The heating treatment temperature is preferably 70 to 180° C. With the heating treatment temperature set within this range, a rigid coating film 206 is formed. The heating time is not particularly limited. Taking the effect of the heating treatment and the stability of pattern shape and the like into consideration, however, the heating time is preferably in the range of 30 to 300 seconds, more preferably 60 to 180 seconds.

Next, the surface of the first resist pattern 207 provided thereon with the coating film is preferably washed with a cleaning liquid. This ensures that, even if the water-soluble resin is adhered to a region where the first resist pattern 204 is absent, the water-soluble resin is washed away or becomes very low in concentration. On the other hand, the water-soluble resin adhered to the surface of the first resist pattern remains intact there, since it has been cross-linked. Consequently, as shown in FIG. 16D, the coating film 206 is sufficiently formed on the surface of the first resist pattern 204, while the coating film 206 is not formed at all or is not substantially formed in the other regions. Thus, the coating film 206 can be formed on the surface of the first resist pattern 204 with high selectivity of coating. Further, the washing ensures that the coating film 206 has a thickness which is small and uniform. Specifically, when washing is conducted, a surplus of the water-soluble resin which is not cross-linked on the first resist pattern is removed, whereas the water-soluble resin boned firmly to the surface of the first resist pattern 204 by the cross-linking is left uniformly on the surface of the pattern. The thin film of the water-soluble resin on the nanometer level is formed in a uniform thickness, extremely accurately, and with high reproducibility. The thickness of the coating film 206 is preferably 1 to 30 nm.

Subsequently, as shown in FIG. 16E, a second resist layer 208 composed of a second chemically amplified resist composition is formed so as to fill up the cavities between portions of the first resist pattern 207 provided thereon with the coating film. Subsequently, as shown in FIGS. 16E and 16F, the second resist layer 208 is selectively exposed to light through a second mask 222, followed by development, to form a second resist pattern 209.

On the other hand, in recent years, researches have been vigorously made of integrated chemical systems for integrating operations necessary for chemical processes, by use of microchips in which fine liquid flow networks (microchannels) are formed on a glass substrate. A microchannel can be grasped as a fine chemical experiment space (unit operation space). When a substance is put into reaction or separated in the microchannel, a size effect becomes actual in the fine space, whereby drastic scale-down of not only the amount of substance to be treated but also the reaction time can be achieved. For instance, it has been reported that, in an example wherein a carcinoembryonic antigen (CEA) as a tumor marker used for diagnosis of large bowel cancer was determined by use of an immunodiagnostic chip utilizing an antigen-antibody reaction, the analysis time could be shortened to 30 minutes, as contrasted to 50 hours according to the related art (see Hideaki Hisamoto, Manabu Tokeiji, and Takehiko Kitamori, "Kagaku-to Kogyo" (Chemistry and Chemical Industry), 54, pp. 564 to 568 (2001), hereinafter referred to as Non-patent Document 1).

In these researches, at present, chips in which microchannels are formed in a glass substrate or silicon substrate by etching are used, taking chemical resistance and the like into consideration. However, glass substrates and silicon substrates have problems on a practical-use basis in that they are expensive, heavy, and unable to be disposed of by incineration. In view of this, Japanese Patent Laid-open No. 2005-265634 (claim 8; pp. 10 to 15; FIG. 1) (hereinafter referred to as Patent Document 2) proposes a method of manufacturing a resin-made microchannel array, including the steps of:

forming a pattern of a resist on a substrate;

depositing a metal according to the resist pattern formed on the substrate, thereby forming a metallic structure; and forming a resin-made microchannel substrate by use of the metallic structure.

In this method, the resist pattern is produced by photolithography, the metallic structure is produced by a vacuum evaporation method or a sputtering method and a plating method while using the resist pattern as a mold, and the resin-made microchannel substrate is produced by injection molding or the like using the metallic structure as a mold. Patent Document 2 describes that according to this method, ten thousands to fifty thousands of resin-made microchannel substrates, possibly no less than two hundreds of thousands of resin-made microchannel substrates can be produced by use of a single metallic structure, and, thus, resin-made microchannels can be obtained with good productivity, at low cost and with high accuracy.

SUMMARY OF THE INVENTION

Patent Document 1 describes that, when a coating film forming aqueous solution 205 is applied and then the coating film is subjected to a heating treatment, diffusion of an acid (hydrogen ions) is accelerated and a cross-linking reaction of a water-soluble resin and a water-soluble cross-linking agent is brought about. However, the chemically amplified resist used in Patent Document 1 is a positive-type resist, and the first resist pattern 204 corresponds to those regions of the first resist layer 202 which have not been exposed to light. Therefore, the hydrogen ions present on the surface of the first resist pattern 204 are limited to the hydrogen ions having moved by diffusion from the exposed regions of the resist removed by dissolution. Accordingly, a conspicuous difference in hydrogen ion concentration can hardly be considered to exist between the surface region of the first resist pattern 204 and the other regions. Besides, the hydrogen ion concentration can hardly be considered to be high enough to effectively advance the above-mentioned cross-linking reaction. Therefore, it is considered to be difficult to form the coating film 206 with the required thickness on the surface of the first resist pattern 204 with high selectivity of coating, by the method of Patent Document 1.

On the other hand, the method of Patent Document 2 is a method by which resin-made microchannel substrates can be obtained with good productivity and at low cost, in the case where tens of thousands of microchannel substrates are produced. However, in the case where a diversity of microchannel substrates are produced in small numbers, a multiplicity of molds corresponding respectively to the many kinds of the microchannel substrates should be produced. Accordingly, this method cannot be said to be good in productivity.

Thus, there is a need for a method of modifying a positive-type chemically amplified resist pattern so as to enhance solvent resistance, resistance to exposure and development, or the like of a resist pattern of a positive-type chemically amplified resist, a modifier for a positive-type chemically amplified resist pattern to be used in the modifying step, and a resist pattern structure having a positive-type chemically amplified resist pattern modified by the modifying method.

An embodiment of the present invention pertains to a method of modifying a positive-type chemically amplified resist pattern, including the steps of:

applying to a surface of a resist pattern including a positive-type chemically amplified resist containing a photo acid generator operable to generate an acid when exposed to light and a resin component having a solubility to be changed by an action of the acid, an aqueous solution of a modifier for the positive-type chemically amplified resist pattern, the aqueous solution containing a water-soluble cross-linking agent capable of penetrating the resist pattern from the surface and capable of a cross-linking reaction with the resin component under an action of the acid, and a penetration accelerator for accelerating penetration of the cross-linking agent into the resist pattern, the cross-linking agent and the penetration accelerator being dissolved in water or a mixed solvent containing water as a main ingredient, so as to permit the cross-linking agent to penetrate the resist pattern;

removing a surplus of the cross-linking agent other than the cross-linking agent having penetrated the resist pattern and the cross-linking agent having been adhered to an outermost surface of the resist pattern; and irradiating the resist pattern penetrated by the cross-linking agent with ultraviolet light so as to cause the acid to be generated from the photo acid generator, and to cause the cross-linking reaction of the resin component and the cross-linking agent to take place under the action of the acid, thereby forming a hardened layer at least at a surface layer part of the resist pattern.

Also, another embodiment of the present invention pertains to a modifier for a positive-type chemically amplified resist pattern, including:

a water-soluble cross-linking agent which is capable of penetrating a resist pattern including a positive-type chemically amplified resist containing a photo acid agent operable to generate an acid when exposed to light and a resin component having a solubility to be changed by the action of the acid, from a surface of the resist pattern, and which is capable of across-linking reaction with the resin component under the action of the acid; and a penetration accelerator operable to accelerate the penetration of the cross-linking agent into the resist pattern;

the cross-linking agent and the penetration accelerator being dissolved in water or a mixed solvent containing water as a main ingredient.

Further, yet another embodiment of the present invention pertains to a resist pattern structure, including at least:

a support; and a positive-type chemically amplified resist pattern which is disposed on the support, has been patterned into a predetermined shape, and is provided, at least at a surface layer part thereof, with a hardened layer having a polymerization product formed from a resin component of a resist and a cross-linking agent.

According to the method of modifying a positive-type chemically amplified resist pattern pertaining to the embodiment of the present invention, to the surface of the resist pattern having the positive-type chemically amplified resist is applied the aqueous solution of the modifier for the positive-type chemically amplified resist pattern. The aqueous solution contains, dissolved in water or a mixed solvent containing water as a main ingredient, the water-soluble cross-linking agent capable of penetrating the resist pattern and capable of a cross-linking reaction with the resin component and the penetration accelerator for accelerating the penetration of the cross-linking agent into the resist pattern. As a result of the application of the aqueous solution, the cross-linking agent penetrates at least a surface layer part of the resist pattern. Next, a step of removing a surplus of the cross-linking agent other than the cross-linking agent having penetrated the resist pattern and the cross-linking agent having been adhered to an outermost surface of the resist pattern is conducted, so that the unrequired portion of the cross-linking agent would not remain. Thereafter, the resist pattern penetrated by the cross-linking agent is irradiated with ultraviolet (UV) light. As a result, a sufficient amount of the acid is generated from the photo acid generator, and, under the action of the acid, a cross-linking reaction of the resin component and the cross-linking agent is caused to take place. This ensures that a hardened layer can be reliably formed at least at a surface layer part of the resist pattern.

In this instance, with the penetration of the cross-linking agent being limited mainly to the surface layer part of the resist pattern, there is no fear that the stability of size and shape of the resist pattern might be spoiled; therefore, the hardened layer can be formed while maintaining the shape of the resist pattern. In addition, the hardened layer can be selectively formed only in the inside of the resist pattern and at the outermost surface of the resist pattern. Therefore, the formation of the hardened layer does not obstruct other treatments applied to other regions, such as a support.

The modifier for a positive-type chemically amplified resist pattern pertaining to the embodiment of the present invention is suitably used in the method of modifying a positive-type chemically amplified resist pattern pertaining to the embodiment of the invention. Since water or a mixed solvent containing water as a main ingredient is used as solvent in the modifier, the resist pattern is hardly dissolved in the modifier.

According to the resist pattern structure pertaining to the embodiment of the present invention, the positive-type chemically amplified resist pattern constituting the structure has been patterned into a predetermined shape, and, in addition, the hardened layer having the polymerization product of the resin component of the resist and the cross-linking agent is formed at least at a surface layer part of the resist pattern. Therefore, the resist pattern structure pertaining to the embodiment of the invention has an enhanced solvent resistance. Accordingly, the resist pattern structure can be suitably used for various applications where solvent resistance is demanded, for example, application as a microchip constituting the above-mentioned integrated chemical system.

BRIEF DESCRIPTION OF THE DRAWINGS

FIGS. 5A to 5F are SEM images of a resist pattern section after a cross-linking agent penetration treatment according to Example 1 of the present invention;

FIG. 6 is infrared absorption spectra of a resist pattern before and after the cross-linking agent penetration treatment according to Example 1-1 of the present invention;

FIGS. 12A to 12E are SEM images of a resist pattern section at each stage of the treatment steps in Example 4-4 of the present invention;

FIGS. 13A to 13C are SEM images of resist pattern sections before and after a solvent resistance test in Examples 4-1 to 4-3 of the present invention;

DETAILED DESCRIPTION OF THE PREFERRED EMBODIMENTS

Figure 1A:
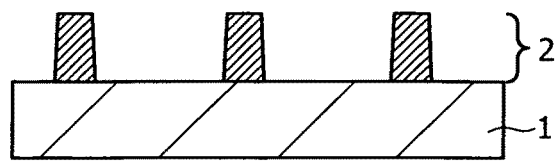
FIGS. 1A to 1E are sectional views showing a method of modifying a positive-type chemically amplified resist and a resist pattern structure based on an embodiment of the present invention.

In the step of causing the above-mentioned cross-linking agent to penetrate in the method of modifying the positive-type chemically amplified resist pattern according to an embodiment of the present invention, preferably, heating at a temperature of not more than 150° C., for example, at a temperature of 85 to 115° C., is conducted to accelerate the penetration of the cross-linking agent.

In addition, in the step of forming the hardened layer, preferably, heating at a temperature of not more than 150° C., for example, at a temperature of 85 to 115° C., is conducted to accelerate the cross-linking reaction.

Besides, at the above-mentioned water-soluble cross-linking agent, preferably, at least one substance selected from the group including triazine ($C_3H_3N_3$) derivatives and urea derivatives is used.

In addition, as the above-mentioned penetration accelerator, preferably, ethanol and/or methanol is used.

Besides, as a penetration aid for assisting the penetration of the cross-linking agent into above-mentioned resist pattern, preferably, polyvinyl alcohol is contained in the above-mentioned modifier.

In addition, preferably, an aqueous solution of the penetration accelerator is preliminarily applied to the surface of the resist pattern, and, after evaporation thereof, a treatment for applying the modifier to the surface of the resist pattern is conducted. By this preliminary treatment (pre-wetting treatment) with the aqueous solution not containing the cross-linking agent, it is possible to accelerate the penetration of the cross-linking agent in the treatment for applying the modifier.

Besides, preferably, the treatment for applying the modifier to the surface of the resist pattern is conducted plural times. This makes it possible to increase the penetration amount of the cross-linking agent, without changing the concentration of the cross-linking agent in the modifier.

In the modifier for the positive-type chemically amplified resist pattern according to an embodiment of the present invention, preferably, the above-mentioned water-soluble cross-linking agent is at least one substance selected from the group including triazine ($C_3H_3N_3$) derivatives and urea derivatives.

In addition, preferably, the above-mentioned penetration accelerator is ethanol and/or methanol.

Besides, preferably, polyvinyl alcohol is contained in the modifier as a penetration aid for assisting the penetration of the cross-linking agent into the resist pattern.

In the resist pattern structure according to an embodiment of the present invention, preferably, the cross-linking agent is at least one substance selected from the group including triazine ($C_3H_3N_3$) derivatives and urea derivatives.

In addition, preferably, the material of the above-mentioned support is a polymer resin.

Now, preferred embodiments of the present invention will be described specifically and in detail below, referring to the drawings.

<Embodiment>

In this embodiment, mainly, examples of the methods of modifying the positive-type chemically amplified resist, the modifiers for the positive-type chemically amplified resist and the resist pattern structures will be described.

Figure 14A:
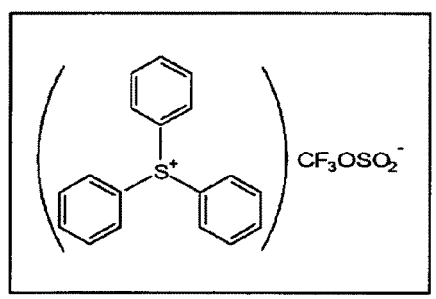
FIGS. 14A to 14D illustrate examples of a component of a positive-type chemically amplified resist and a reaction thereof.
Figure 14B:
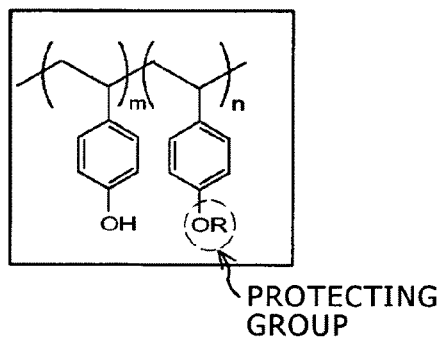
Figure 14C:
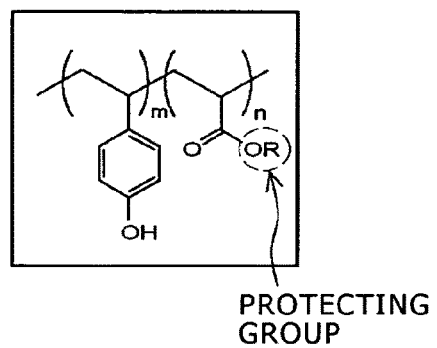
Figure 14D:
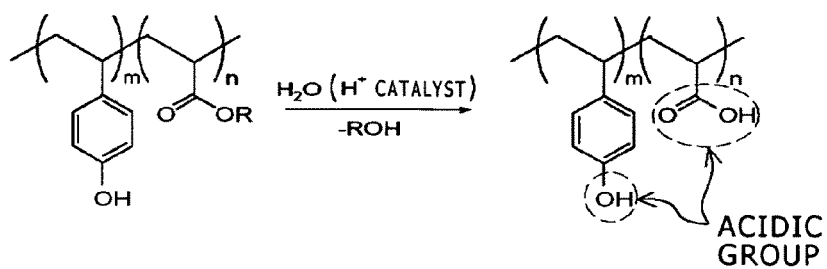
Figure 15A:
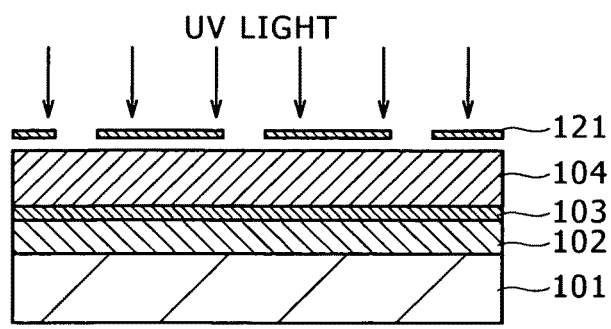
FIGS. 15A to 15H are sectional views for illustrating a double patterning method cited in Patent Document 1.
Figure 15B:
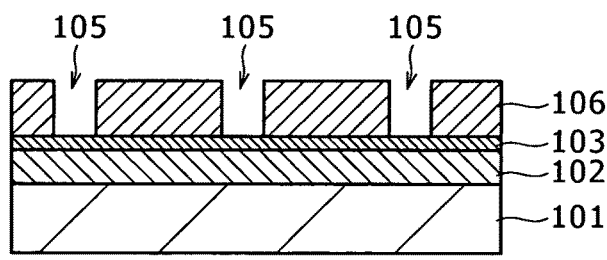
Figure 15C:
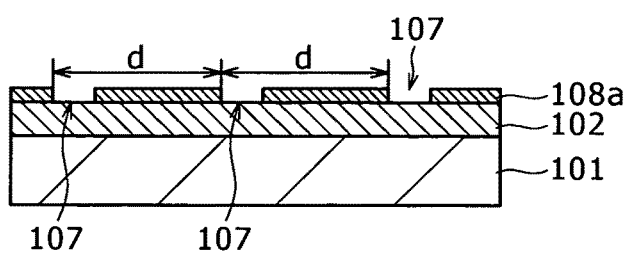
Figure 15D:
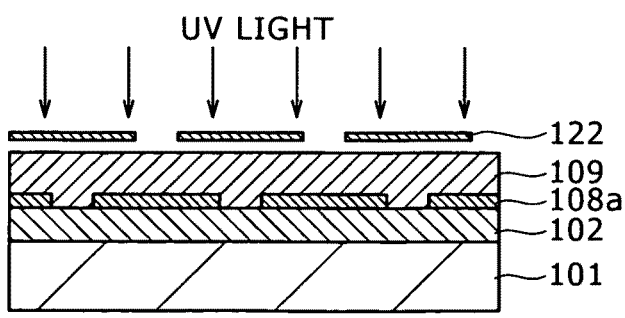
Figure 15E:
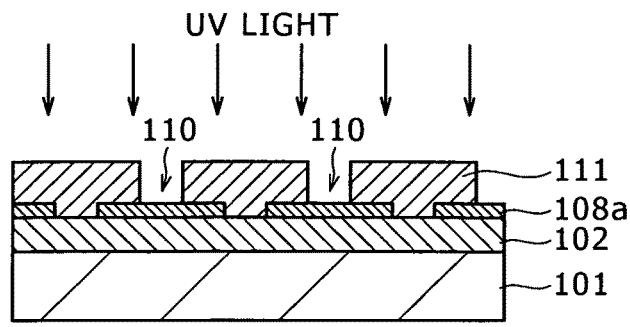
Figure 15F:
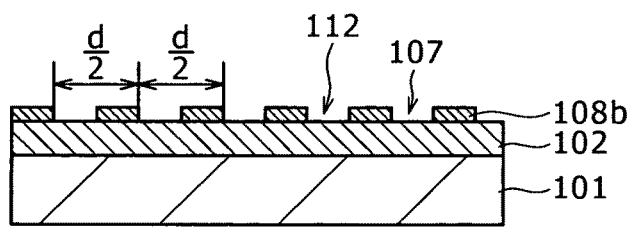
Figure 15G:
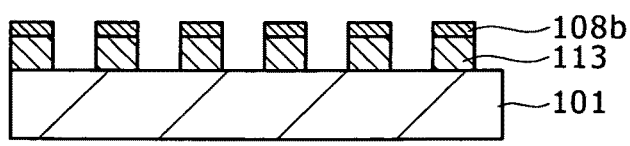
Figure 15H:
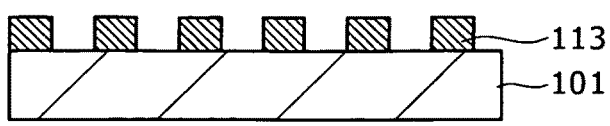
Figure 16A:
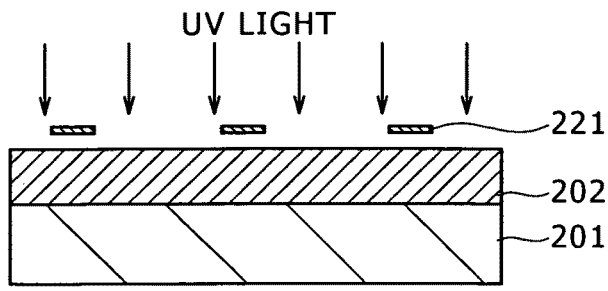
FIGS. 16A to 16F are sectional views showing a pattern forming method proposed in Patent Document 1.
Figure 16B:
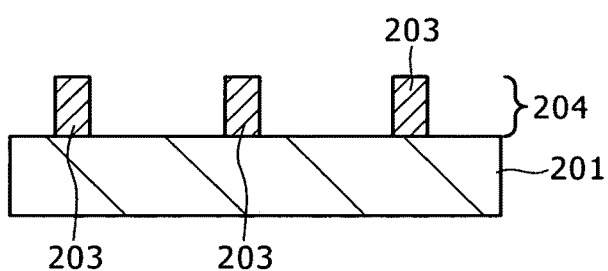
Figure 16C:
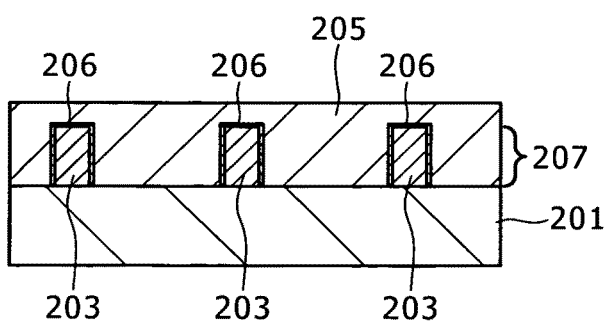
Figure 16D:
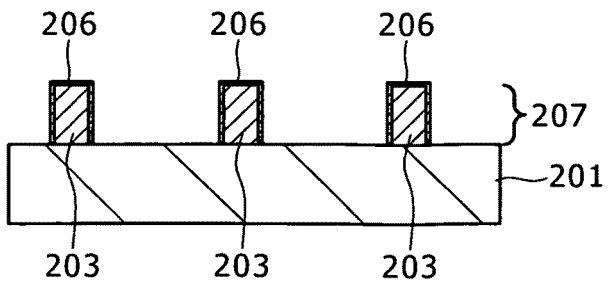
Figure 16E:
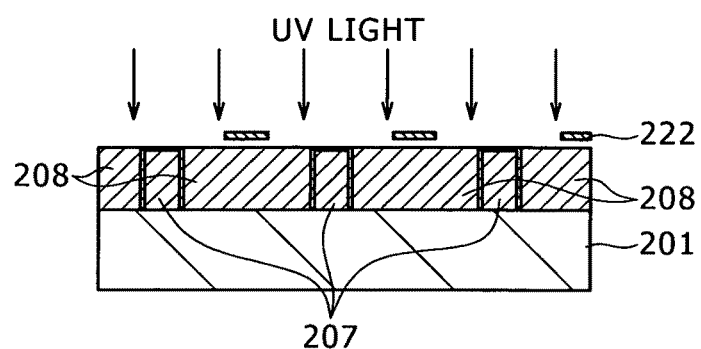
Figure 16F:
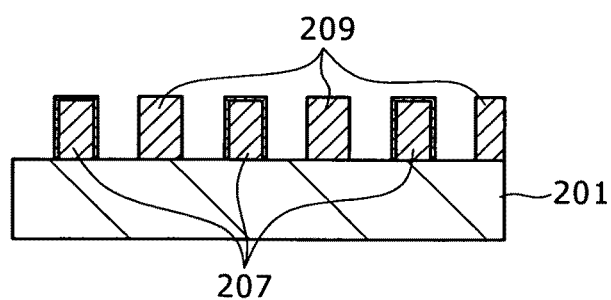

FIGS. 1A to 1E are sectional views for illustrating the method of modifying the positive-type chemically amplified resist based on this embodiment. In the present method, first, it is assumed that, as shown in FIG. 1A, a resist pattern 2 composed of a positive-type chemically amplified resist is preliminarily formed on a support 1. As above-mentioned, the chemically amplified resist contains a photo acid generator which generates an acid (hydrogen ion $H^+$) upon exposure to light and a resin component of which the solubility is varied under the action of the acid. The positive-type chemically amplified resist contains the photo acid generator such as triphenylsulfonium trifluoromethanesulfonate shown in FIG. 14A, and the resin component such as a polyhydroxystyrene derivative and a hydroxystyrene-(meth)acrylic acid copolymer derivative, both shown in FIG. 14B, or a poly(meth)acrylic acid derivative (not shown).

Figure 1B:
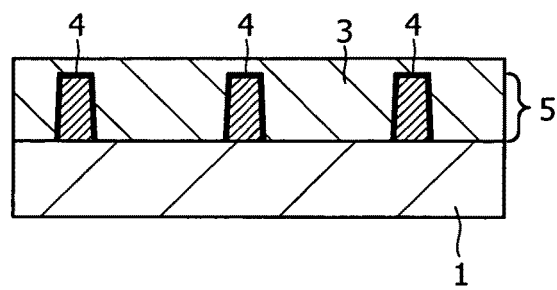

Next, as shown in FIG. 1B, an aqueous solution 3 of the modifier for the positive-type chemically amplified resist which contains a water-soluble cross-linking agent, a penetration accelerator and a penetration aid is applied to the surface of the resist pattern 2 by a dipping method or a coating method. After the aqueous modifier solution 3 is applied, a heating treatment may be conducted to heat the resist pattern 2 and the aqueous modifier solution 3 at a temperature of not more than 150° C., for example, at a temperature of 85 to 115° C. This makes it possible to accelerate the penetration of the cross-linking agent into the resist pattern 2. The temperature is limited to or below 150° C. because a temperature in excess of this limit may result in that the resist pattern 2 is softened and deformed by heat. Consequently, the cross-linking agent penetrates mainly a surface layer portion 4 of the resist pattern 2. In this instance, water or a mixed solvent containing water as a main ingredient is used as a solvent of the modifier, so that there is little possibility of dissolution of the pattern 2 into the aqueous modifier solution 3.

Figure 2A:
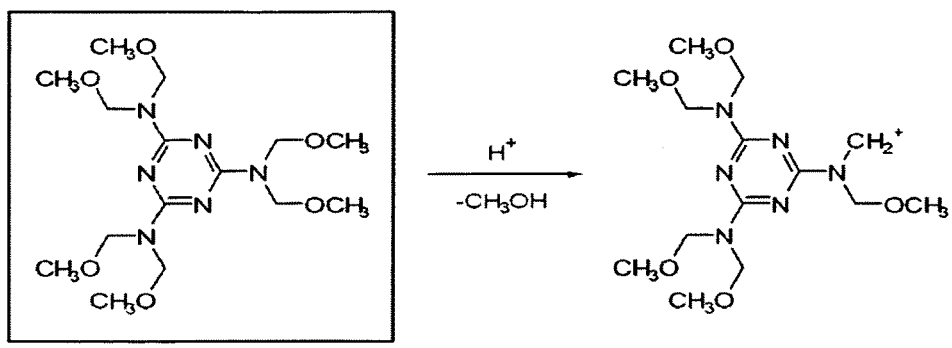
FIGS. 2A to 2C illustrate an example of a cross-linking agent contained in a modifier for the positive-type chemically amplified resist and reactions thereof in the embodiment.

As the water-soluble cross-linking agent, preferably, there is used a triazine compound having a plurality of methylol groups, for example, hexakis(methoxymethyl)melamine, which is known as a thermosetting resin, from the viewpoint of a high cross-linking reactivity thereof and a large number of cross-linking points therein (see FIG. 2A). Other than this kind of compounds, there may also be used a urea compound having a plurality of methylol groups, for example, dimethylolurea. The penetration accelerator is a substance which has affinity for both water and the positive-type chemically amplified resist constituting the resist pattern 2 and which is capable of swelling the resist pattern 2. The penetration accelerator functions to form paths for penetration of the cross-linking agent into the resist pattern 2, thereby accelerating the penetration of the cross-linking agent. In addition, the penetration accelerator functions also to enhance releasability of a surplus of the aqueous modifier solution 3. Preferable examples of the penetration accelerator include ethanol and methanol. The penetration accelerator prevents the resist pattern 2 from collapsing through excessive swelling or shrinking, which might be caused by the penetration of the cross-linking agent, the heating treatment or the like. As the penetration aid, polyvinyl alcohol or the like is preferably used because it is water-soluble, high in viscosity, high in safety, and easily available.

Figure 1C:
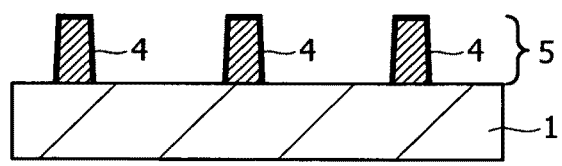

Subsequently, a surplus of the cross-linking agent other than the cross-linking agent having penetrated the resist pattern 2 and the cross-linking agent adhered to the outermost surface of the resist pattern 2 is removed by water washing or the like. Consequently, as shown in FIG. 1C, the unrequired cross-linking agent is prevented from remaining. Therefore, the hardened layer can be selectively formed only in the inside of the resist pattern 2 and at the outermost surface of the resist pattern 2. Accordingly, the formation of the hardened layer would not obstruct other treatments applied to other regions of the support 1.

Figure 1D:
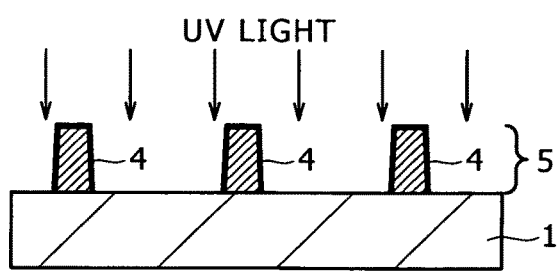

Next, as shown in FIG. 1D, the resist pattern 2 penetrated by the cross-linking agent is irradiated with ultraviolet (UV) light. As a result, a sufficient amount of acid can be generated from the photo acid generator, unlike in the method of Patent Document 1 in which irradiation with UV light is not conducted.

Figure 1E:
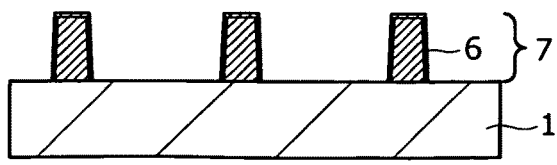

After the irradiation with UV light, a heating treatment of heating the resist pattern 2 at a temperature of not more than 150° C., for example, at a temperature of 85 to 115° C. is conducted, as shown in FIG. 1E. By the heating treatment, a cross-linking reaction of the resin component and the cross-linking agent is effected under the action of the above-mentioned acid, whereby a hardened layer 6 can be reliably formed at least at a surface layer portion 4 of the resist pattern 2. The heating treatment may be started during the irradiation with UV light. The heating treatment temperature is limited to or below 150° C. because a temperature in excess of this limit may result in that the resist pattern 2 is deformed through being softened by heat.

The positive-type chemically amplified resist pattern 7 thus modified has been not only patterned into a predetermined shape but also formed, at least at the surface layer part thereof, with the hardened layer 6 composed of a polymerization product formed from the resin component of the resist and the cross-linking agent. Therefore, the modified resist pattern 7 has been enhanced in solvent resistance, resistance to exposure and development, and the like, so that it can be suitably used as the first resist pattern in the double patterning method described in the paragraph of background art above. The modified resist pattern 7 would not be eluted or deformed when subjected to such treatments as the second-time application of the resist coating liquid, exposure and development, etc. Where the penetration of the cross-linking agent in the above-mentioned modifying step is restricted mainly to the surface layer part 4 of the resist pattern, there is little fear of spoiling the safety of size and shape of the resist pattern 2; accordingly, the hardened layer 6 can be formed while maintaining the shape of the resist pattern 2.

In addition, the resist pattern structure 10 shown in FIG. 1E has been enhanced in solvent resistance and chemical resistance, as compared with the untreated resist pattern structure, and can therefore be suitably used for various applications where such resistance is demanded, for example, as a microchip for constituting the integrated chemical system described in the paragraph of background art above. In this case, where the material of the above-mentioned support is a polymer resin, it is possible to make the most of the characteristic features of the polymer resin, such as being light in weight, being inexpensive, and being insusceptible to breakage.

The method of producing the positive-type chemically amplified resist pattern 2 is not particularly limited. For example, a method may be adopted in which, as usual, a resist layer is formed on the whole surface of the support 1, followed by patterning the resist layer by photolithography. Or, a method may be adopted in which a coating liquid of a positive-type chemically amplified resist is selectively applied onto the support 1 by an ink jet printing method or the like, thereby directly forming the resist pattern 2.

Figure 2B:
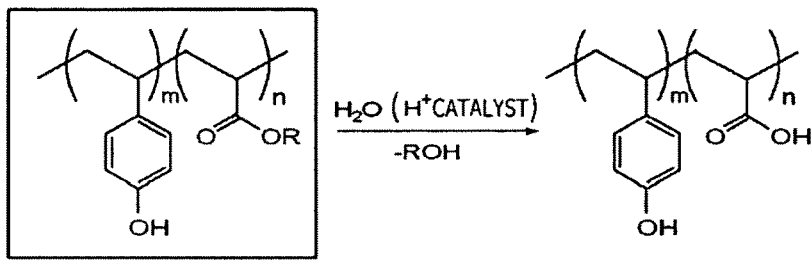
Figure 2C:
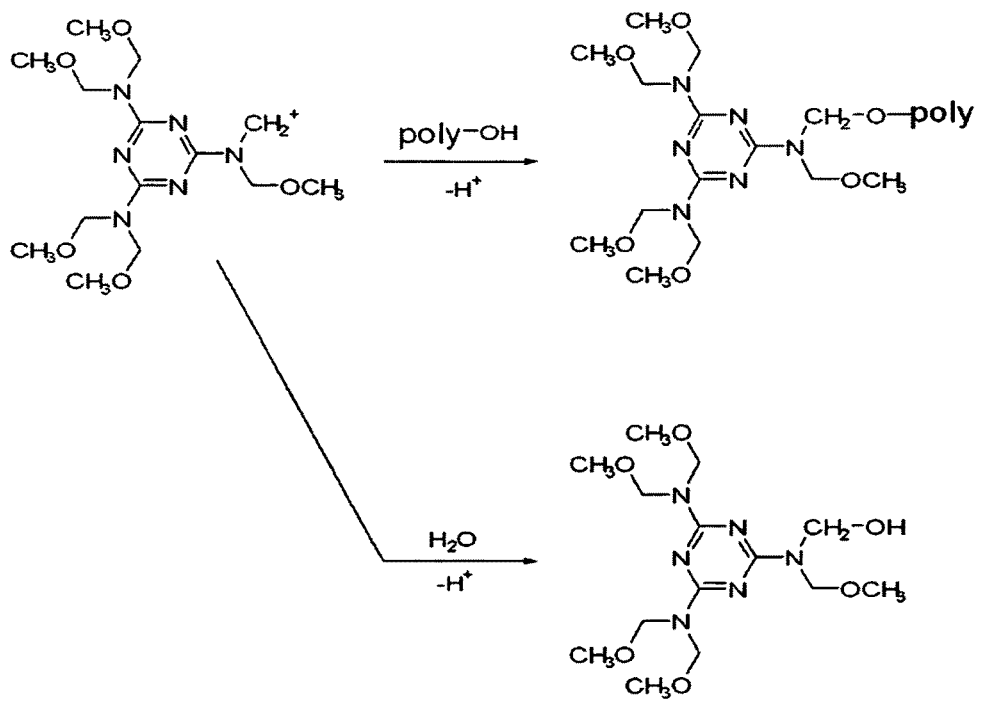

FIGS. 2A to 2C illustrate an example of the cross-linking agent based on this embodiment and cross-linking reactions taking place in a resist pattern 5 penetrated by the cross-linking agent when hydrogen ions $H^+$ are supplied from the photo acid generator. The cross-linking agent such as hexakis (methoxymethyl)melamine is hydrolyzed by the action of the hydrogen ion $H^+$ as shown in FIG. 2A. As above-mentioned, the resin component constituting the positive-type chemically amplified resist is also hydrolyzed by the action of the hydrogen ion $H^+$ as shown in FIG. 2B. When both of them are present, the carbocations produced upon the reaction shown in FIG. 2A are put into a cross-linking reaction with the hydroxyl groups (In the figures, abridged to poly-OH) produced upon the reaction shown in FIG. 2B, as shown in FIG. 2C. Besides, some of the carbocations react with water. In either of the reactions shown in FIG. 2C, the hydrogen ion is regenerated. Therefore, when the reaction shown in FIG. 2A and the reaction shown in FIG. 2C are summed up, it can be said that the hydrogen ion $H^+$ functions in the manner of a catalyst, thereby repeatedly accelerating the cross-linking reaction. As a result, a cross-linked structure of the cross-linking agent and the resin component is formed, and the hardened layer 6 is produced.

Incidentally, the present inventor has confirmed that when a positive-type chemically amplified resist TX1311 [product code; made by AZ Electronic Materials (Japan) K.K.] is admixed directly with hexakis(methoxymethyl)melamine and a resist layer is formed from the admixture and then irradiated with UV light, the unexposed portion of the resist layer is soluble in a solvent whereas the exposed portion of the resist layer is hardened and insoluble in the solvent.

Figure 3A:
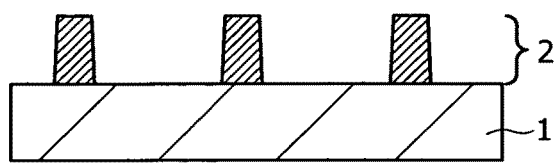
FIGS. 3A to 3C are sectional views showing part of steps of a method of modifying a positive-type chemically amplified resist based on a modification of the embodiment.
Figure 3B:
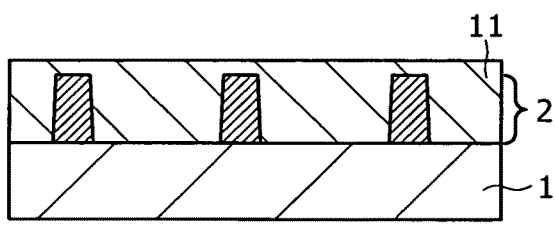
Figure 3C:
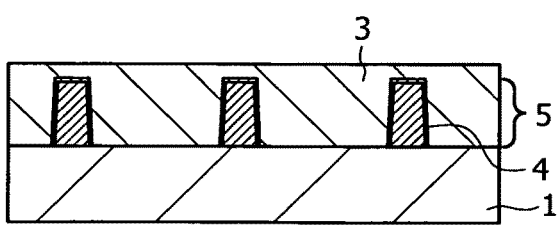

FIGS. 3A to 3C are sectional views showing part of steps of a method of modifying a positive-type chemically amplified resist based on a modification of the embodiment. This modification is characterized in that, after formation of a resist pattern 2, a treatment (pre-wetting treatment) in which an aqueous solution 11 containing only a penetration accelerator and not containing any cross-linking agent is applied to the resist pattern 2 is conducted before applying an aqueous modifier solution 3 is applied to the resist pattern. By this preliminary treatment, it is possible to accelerate the penetration of the cross-linking agent in the treatment for applying the modifier. The reason for this acceleration of penetration is considered to reside in that the resist pattern 2 is swelled by the action of the penetration accelerator with the result of formation, in the resist pattern 2, of paths for penetration of the cross-linking agent.

Figure 10:
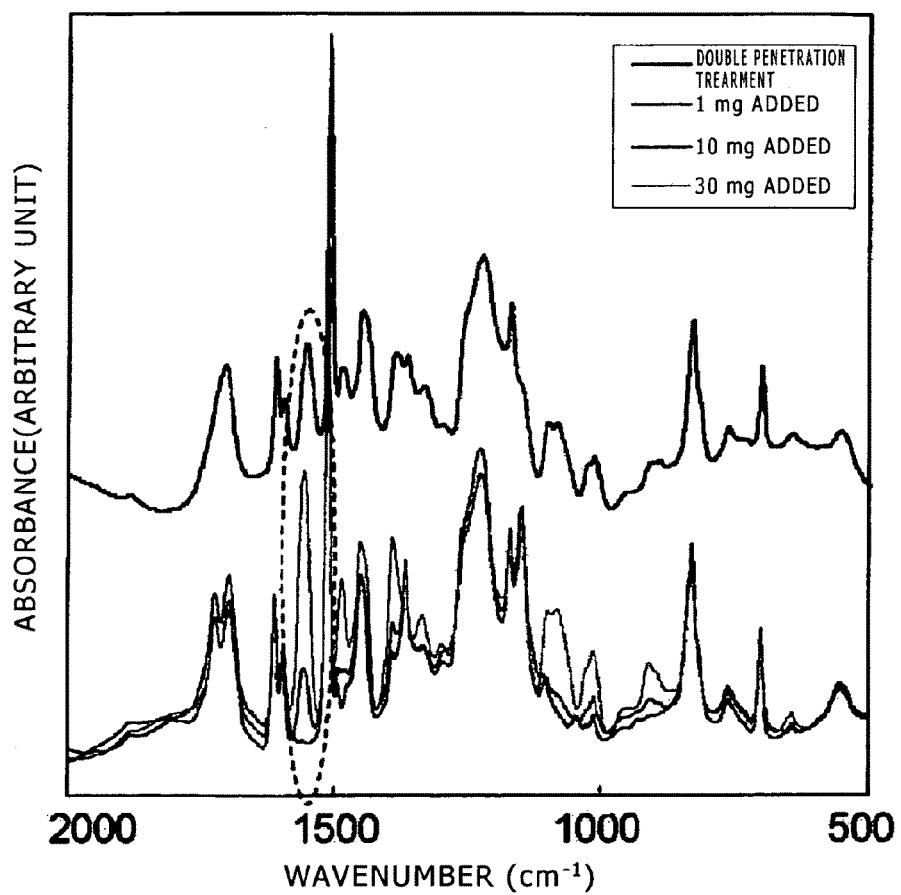
FIG. 10 shows infrared absorption spectra of a resist pattern and resist layers, for estimating the penetration amount of a cross-linking agent based on the double penetration treatment according to Example 2 of the present invention.

In addition, the treatment for applying the aqueous modifier solution 3 onto the surface of the resist pattern 2 as shown in FIG. 1B and the water washing and drying treatment shown in FIG. 10 are preferably carried out plural times. This makes it possible to increase the penetration amount of the cross-linking agent without changing the concentration of the cross-linking agent in the aqueous modifier solution 3, as will be shown in Examples later.

Figure 4A:
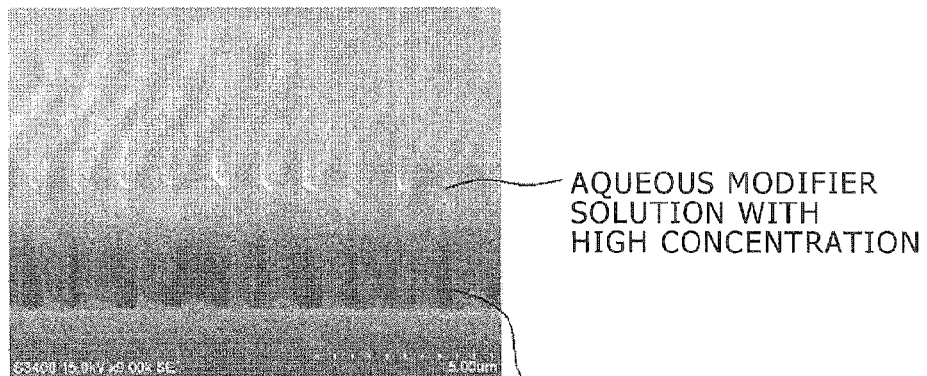
FIGS. 4A to 4C are SEM images of a resist pattern section, showing a method of applying an aqueous modifier solution to a resist pattern having a high aspect ratio in the embodiment.
Figure 4B:
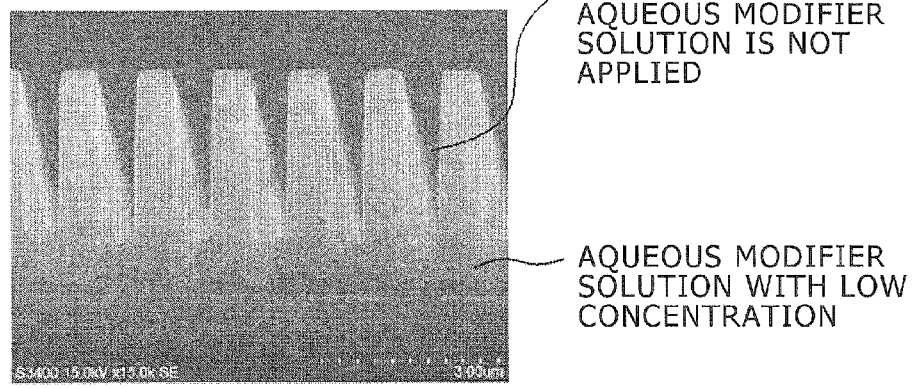
Figure 4C:
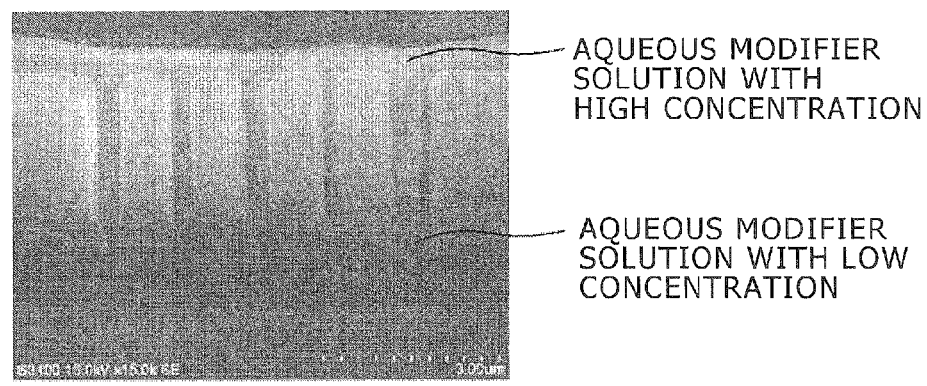

FIGS. 4A to 4C are scanning electron microscope (SEM) images of a section of a resist pattern 2, showing the method of applying an aqueous modifier solution 3 to a resist pattern 2 having a high aspect ratio. In the case where the aspect ratio of the resist pattern 2 is high, if the concentration of the aqueous modifier solution 3 is high, the aqueous modifier solution 3 may be applied only to an upper portion of the resist pattern so that it cannot be applied to a lower portion of the resist pattern 2, as shown in FIG. 4A. On the other hand, if the concentration of the aqueous modifier solution 3 is low, the aqueous modifier solution 3 may be able to wet a lower portion of the resist pattern 2 but unable to wet an upper portion of the resist pattern 2, as shown in FIG. 4B. In such a situation, first, the aqueous modifier solution 3a with a low concentration is applied to the resist pattern 2 and thereafter an aqueous modifier solution 3b with a high concentration is applied, whereby the aqueous modifier solution 3 can be applied to the whole part of the resist pattern 2, as shown in FIG. 4C.

By the various contrivances as above-mentioned, a sufficient amount of the cross-linking agent can be made to penetrate the resist pattern 2 while preventing excessive swelling or collapse of the resist pattern 2.

EXAMPLES

Now, the present invention will be described specifically by showing Examples, which are not limitative of the invention. Incidentally, in the Examples described below, hexakis(methoxymethyl)melamine, ethanol, and polyvinyl alcohol were used as the water-soluble cross-linking agent, the penetration accelerator, and the penetration aid, respectively.

Example 1

In Example 1, a treatment for applying an aqueous modifier solution 3 to a resist pattern 2 formed of a positive-type chemically amplified resist so as to cause a cross-linking agent to penetrate the resist pattern 2 was conducted. In addition, a treatment for irradiating the resist pattern 5 penetrated by the cross-linking agent with UV light so as to effect hardening was carried out. In connection with these treatments, the sectional shape of the resist pattern was observed under a scanning electron microscope (SEM), and the infrared absorption spectrum of the resist pattern was measured, so as to investigate the conditions for the penetration of the cross-linking agent and the conditions for the hardening treatment.
<Cross-linking Agent Penetration Treatment>

First, an aqueous modifier solution was prepared. Hexakis(methoxymethyl)melamine (made by Tokyo Chemical Industry Co., Ltd.) was used as a water-soluble cross-linking agent, ethanol (made by Wako Pure Chemical Industries, Ltd.) was used as a penetration accelerator, and polyvinyl alcohol (PVA) (made by Kanto Chemical Co., Inc.; polymerization degree: 500; saponification degree: 86.5 to 89.0%) was used as a penetration aid. An aqueous hexakis(methoxymethyl)melamine solution with a concentration of 1 g/10 mL, ethanol, and an aqueous PVA solution with a concentration of 1 g/10 mL were mixed in mixing ratios set forth in Table 1 [in the table, hexakis(methoxymethyl)melamine is abridged to triazine derivative].

TABLE 1

| | Volume ratio | | | Weight ratio | | |
|---|---|---|---|---|---|---|
| | Aqueous solution of triazine derivative | Ethanol | Aqueous solution of PVA | Triazine derivative | Ethanol | PVA |
| Example 1-1 | 0.08 | 0.08 | 1.0 | 0.08 | 0.631 | 1.0 |
| Example 1-2 | 0.10 | 0.10 | 1.0 | 0.10 | 0.789 | 1.0 |
| Example 1-3 | 0.125 | 0.125 | 1.0 | 0.125 | 0.987 | 1.0 |
| Example 1-4 | 0.145 | 0.145 | 1.0 | 0.145 | 1.145 | 1.0 |
| Example 1-5 | 0.16 | 0.16 | 1.0 | 0.16 | 1.263 | 1.0 |
| Example 1-6 | 0.10 | 0.30 | 1.0 | 0.10 | 2.368 | 1.0 |

On the other hand, a thick-film resist pattern for KrF laser beams formed on a wafer serving as a support was prepared. The resist pattern was formed of TX1311 [product code; made by AZ Electronic Materials (Japan) K.K.] and had a thickness of 4.4 μm. The wafer was cut into a small rectangular piece measuring 15 mm×30 mm.

Next, about 0.5 mL of the aqueous modifier solution was applied to the resist pattern on the small piece by a spin coating method. Thereafter, heating was conducted at 85° C. for 90 seconds and subsequently at 115° C. for 90 seconds, so as to accelerate penetration of the water-soluble cross-linking agent. Subsequently, while rotating the wafer, washing with water and drying were conducted, to remove a surplus of the aqueous modifier solution.
<SEM Image of Resist Pattern after Cross-linking Agent Penetration Treatment>

FIGS. 5A to 5F are scanning electron microscope (SEM) images of a section of the resist pattern after the cross-linking agent penetration treatment. It was found that the line width of the resist pattern is increased by the cross-linking agent penetration treatment, as compared with the case where an aqueous two-component solution containing ethanol and PVA but not containing any cross-linking agent is applied to the resist pattern. This is considered to suggest that hexakis(methoxymethyl)melamine penetrated the resist pattern or was adhered to the resist pattern.

The rate of increase in line width was greater as the proportions of hexakis(methoxymethyl)melamine and ethanol in the aqueous modifier solution were higher. This is considered to suggest an increase in the penetration amount of hexakis(methoxymethyl)melamine. On the contrary, as the proportion of PVA in the aqueous modifier solution is higher, shape retention characteristics is better. If the proportions of hexakis(methoxymethyl)melamine and ethanol are too high, there would arise deformation or dissolution of the resist pattern, which naturally is inconvenient. From these results, it is seen that the parts by volume of the aqueous hexakis(methoxymethyl)melamine solution and ethanol to be mixed with one part by volume of PVA are preferably not more than 0.125 part by volume.
<Infrared Absorption Spectrum of Resist Pattern before and after Cross-linking Agent Penetration Treatment>

FIG. 6 is infrared absorption spectra of a resist pattern before and after the cross-linking agent penetration treatment according to Example 1-1. While the resist pattern before the cross-linking agent penetration treatment does not have absorption at a wavenumber of 1558 cm$^{-1}$, the resist pattern after the cross-linking agent penetration treatment has absorption at a wavenumber of 1558 cm$^{-1}$. This absorption is considered to be attributable to absorption by vibration of the triazine ring. Since this absorption was observed for the resist pattern after the washing, it is considered that hexakis(methoxymethyl)melamine had penetrated the resist pattern or had been adhered to the outermost surface of the resist pattern.

<Hardening Treatment>

Next, while heating at 115° C., the resist pattern was irradiated with UV light of a wavelength of 254 nm for 60 seconds by use of a UV lamp, so as to cause the photo acid generator to generate an acid. After the irradiation, the heating at 115° C. was further continued for 60 seconds, so as to accelerate the cross-linking reaction.

<Change in Infrared Absorption Spectrum of Resist Pattern during and after Hardening Treatment>

Figure 7A:
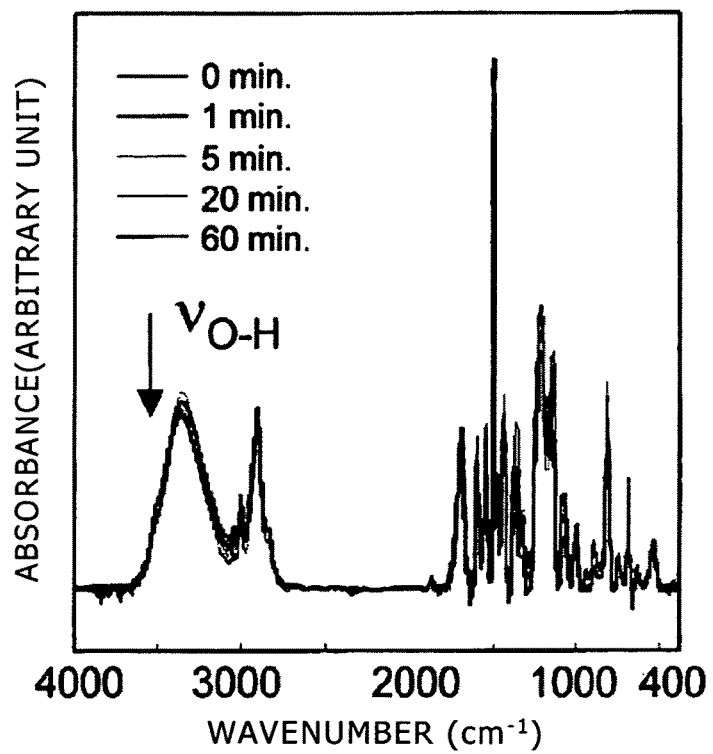
FIGS. 7A and 7B are infrared absorption spectra of the resist pattern during and after a hardening treatment according to Example 1-1 of the present invention.
Figure 7B:
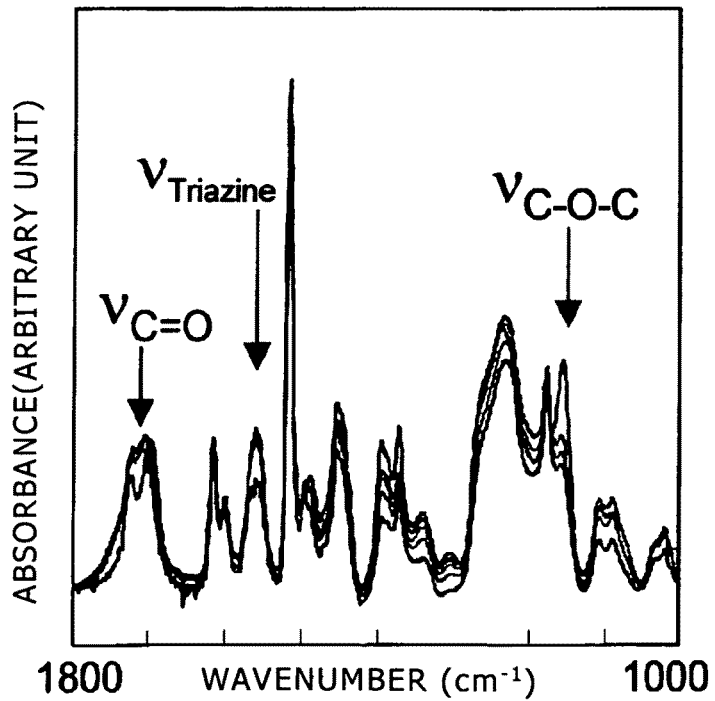

FIGS. 7A and 7B are infrared absorption spectra of the resist pattern during and after a hardening treatment according to Example 1-1. The infrared absorption spectrum of the resist pattern was measured while continuing the heating at 115° C. even after the irradiation with UV light, so as to track the hardening reaction. In the figures, variations of absorption peaks due to characteristic vibrations of C—O—C group and C═O group are little after the lapse of time of one minute. This indicates that the release of the protecting groups in the resist was substantially finished in the lapse of time of one minute.

Example 2

In Example 2, the effect of the pre-wetting treatment described referring to FIGS. 3A to 3C was investigated.

First, in the same manner as in Example 1, as shown in FIG. 3A, a wafer provided thereon with a resist pattern formed from TX1311 (product code) in a thickness of 4.4 µm was cut into a small rectangular piece measuring 15 mm×30 mm.

Next, as the pre-wetting treatment, about 0.5 mL of a solution prepared by mixing water and ethanol in a volume ratio of 4:1 was applied to the resist pattern 2 on the small piece. Thereafter, heating at 115° C. was conducted for 60 seconds, to evaporate off the solution.

Subsequently, in the same manner as in Example 1, about 0.5 mL of an aqueous modifier solution of the same composition as that used in Example 1-3 was applied to the resist pattern 2 on the small piece by a spin coating method. Thereafter, heating was conducted at 85° C. for 90 seconds and subsequently at 115° C. for 90 seconds, so as to accelerate the penetration of the water-soluble cross-linking agent. Then, while rotating the wafer, washing with water and drying were conducted, so as to remove a surplus of the aqueous modifier solution.

Figure 8:
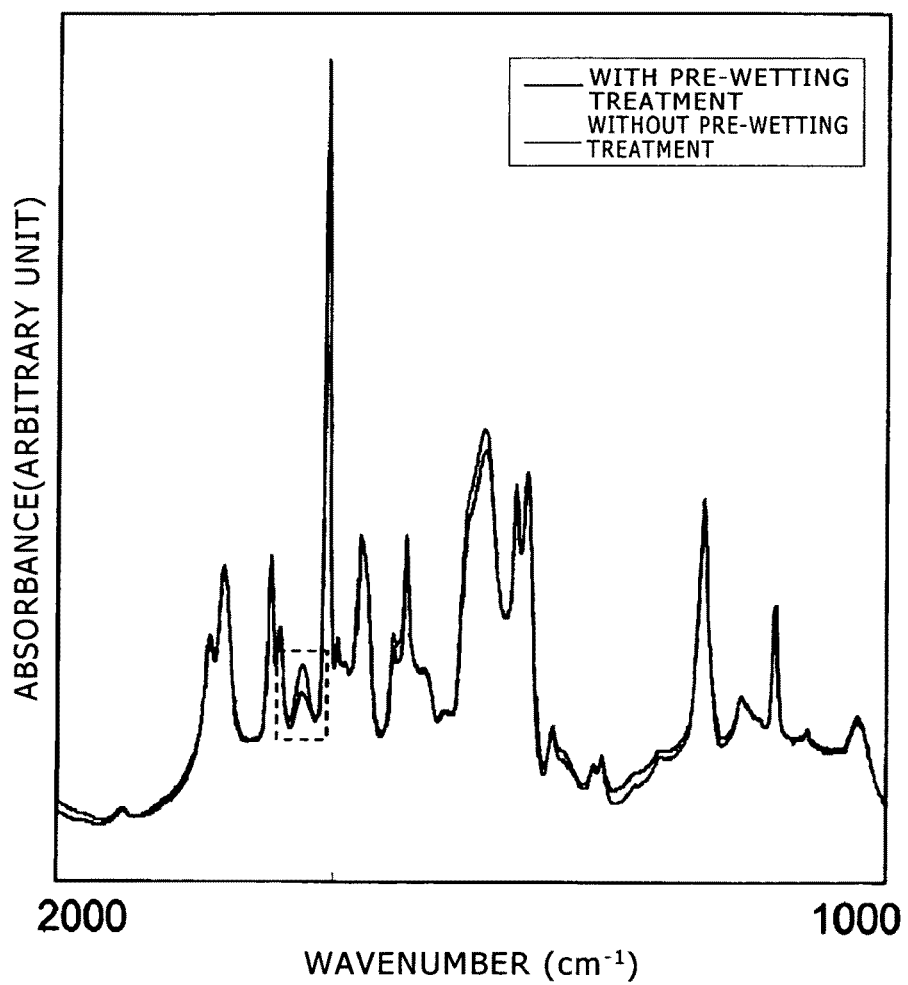
FIG. 8 shows infrared absorption spectra of a resist pattern, showing a difference in penetration amount of a cross-linking agent depending on the presence or absence of a pre-wetting treatment according to Example 2 of the present invention.

FIG. 8 shows infrared absorption spectra of a resist pattern, showing a difference in penetration amount of a cross-linking agent depending on the presence or absence of the pre-wetting treatment. Comparison of the spectra paying attention to the absorption at 1558 cm$^{-1}$ due to the triazine ring shows that the absorption in the resist pattern having undergone the pre-wetting treatment was slightly greater than the absorption in the resist pattern not having undergone the pre-wetting treatment. It is considered that the penetration of the cross-linking agent was accelerated by the pre-wetting treatment. Specifically, it is considered that the resist pattern was swelled by the action of the penetration accelerator with the result of formation, in the resist pattern, of paths for penetration of the cross-linking agent.

Example 3

In Example 3, the effect of a double penetration treatment (penetration-twice treatment) was investigated.

First, in the same manner as in Example 1, a wafer provided thereon with a resist pattern 2 formed from TX1311 (product code) in a thickness of 4.4 µm was cut into a small rectangular piece measuring 15 mm×30 mm.

Next, in the same manner as in Example 1, as shown in FIG. 1B, about 0.5 mL of an aqueous modifier solution of the same composition as that used in Example 1-3 was applied to the resist pattern 2 on the small piece by a spin coating method. Thereafter, heating was conducted at 85° C. for 90 seconds and subsequently at 115° C. for 90 seconds, so as to accelerate the penetration of the water-soluble cross-linking agent. Then, as shown in FIG. 1C, while rotating the wafer, washing with water and drying were conducted, to remove a surplus of the aqueous modifier solution.

Subsequently, the step of applying the aqueous modifier solution and effecting penetration of the cross-linking agent and the step of removing the surplus of aqueous modifier solution by washing with water and then drying were carried out once more.

Figure 9:
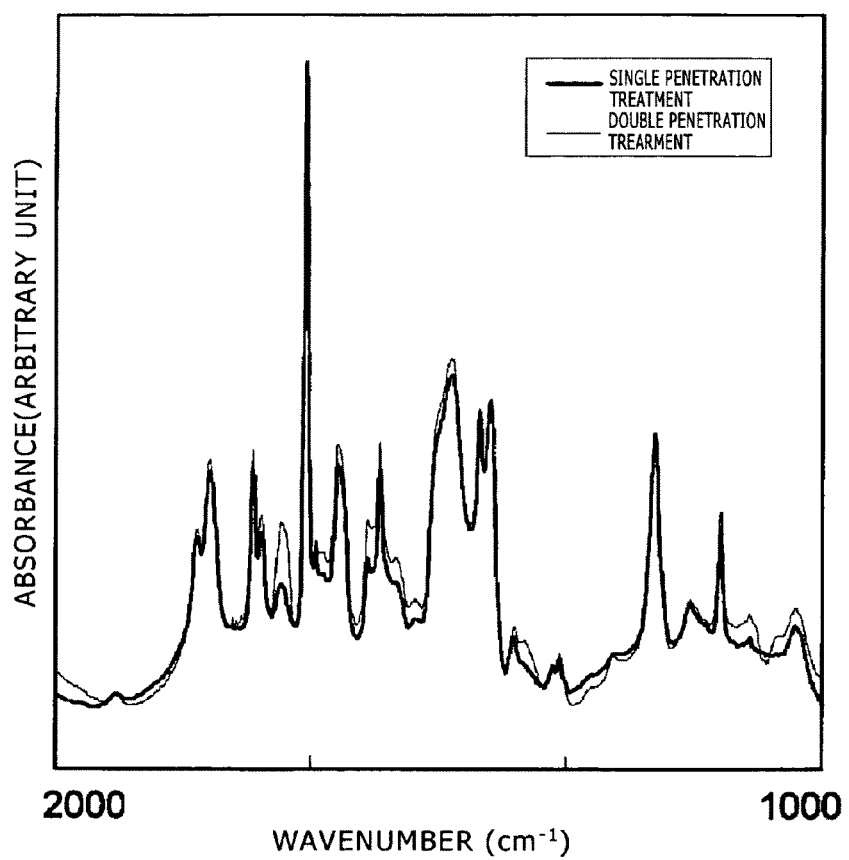
FIG. 9 shows infrared absorption spectra of resist patterns, for comparison between penetration amounts of a cross-linking agent based on a single penetration treatment (penetration-once treatment) and a double penetration treatment (penetration-twice treatment) according to Example 3 of the present invention.

FIG. 9 shows infrared absorption spectra of resist patterns, showing a difference between the penetration amount of the cross-linking agent based on a single penetration treatment and that based on a double penetration treatment. Comparison of the spectra paying attention to the absorption at 1558 cm$^{-1}$ due to the triazine ring shows that the absorption in the resist pattern having undergone the penetration treatment twice was greater than that in the resist pattern having undergone the penetration treatment only once. It is considered that by performing the penetration treatment twice, the penetration amount of the cross-linking agent was increased. Thus, it is possible by conducting the penetration treatment plural times to cause a larger amount of the cross-linking agent to penetrate the resist pattern. The effect of the double penetration treatment is considered to include not only the additional supply of the cross-linking agent but also the swelling of the resist pattern by the action of the penetration accelerator used in the first penetration treatment with the result of formation, in the resist pattern, of paths for penetration of the cross-linking agent, like in the case of the effect of the pre-wetting treatment.

FIG. 10 shows infrared absorption spectra of a resist pattern and resist layers, for estimating the penetration amount of a cross-linking agent based on the double penetration treatment. FIG. 10 shows the infrared absorption spectra of resist layers formed from solutions prepared by directly admixing 5 mL of a TX1311 (product code) resist solution with 1 mg, 10 mg, and 30 mg of the cross-linking agent, respectively, in addition to the infrared absorption spectrum of the resist pattern having undergone the double penetration treatment. It is seen from the results that the penetration amount of the cross-linking agent based on the double penetration treatment is comparable to or more than the penetration amount in the case of using the direct mixture of 5 mL of the resist solution and 10 mg of the cross-linking agent, and is therefore sufficient for insolubilize the resist.

Example 4

In Example 4, using a positive-type chemically amplified resist different from that used in Examples 1 to 3, a treatment for applying an aqueous modifier solution to the resist pattern and effecting penetration of a cross-linking agent was conducted. In addition, a treatment for irradiating the resist pattern penetrated by the cross-linking agent with UV light to effect hardening was conducted, and a solvent resistance test was conducted in which the resist pattern having undergone the hardening treatment was immersed in a solvent used for formation of the resist coating liquid. During and after these processes, variations in the sectional shape of the resist pattern was observed by use of an SEM.

<Cross-linking Agent Penetration Treatment and Hardening Treatment>

First, an aqueous modifier solution was prepared. The above-mentioned aqueous hexakis(methoxymethyl) melamine solution with a concentration of 1 g/10 mL, ethanol, and an aqueous PVA solution with a concentration of 1 g/10 mL were mixed in mixing ratios shown in Table 2 [in the table, hexakis(methoxymethyl)melamine is abridged to triazine derivative].

TABLE 2

|  | Volume ratio | | | Weight ratio | | |
|  | Aqueous solution of triazine derivative | Ethanol | Aqueous solution of PVA | Triazine derivative | Ethanol | PVA |
| --- | --- | --- | --- | --- | --- | --- |
| Example 4-1 | 0.08 | 0.08 | 1.0 | 0.08 | 0.631 | 1.0 |
| Example 4-2 | 0.10 | 0.10 | 1.0 | 0.10 | 0.789 | 1.0 |
| Example 4-3 | 0.125 | 0.125 | 1.0 | 0.125 | 0.987 | 1.0 |
| Example 4-4 | 0.167 | 0.167 | 1.0 | 0.167 | 1.315 | 1.0 |

On the other hand, a thin-film resist pattern for KrF laser beams formed on a wafer serving as a support was prepared, in which the resist pattern was formed from K101G (product name; made by JSR Corporation) and had a thickness of 1.1 μm. The wafer was cut into a small rectangular piece measuring 15 mm×30 mm.

Next, about 0.5 mL of the aqueous modifier solution was applied to the resist pattern on the small piece by a spin coating method. Thereafter, heating was conducted at 85° C. for 90 seconds and subsequently at 115° C. for 90 seconds, so as to accelerate penetration of the water-soluble cross-linking agent. Subsequently, while rotating the wafer, washing with water and drying were conducted, to remove a surplus of the aqueous modifier solution.

Next, while heating at 115° C., the resist pattern was irradiated with UV light of a wavelength of 254 nm for 60 seconds by use of a UV lamp, so as to cause the photo acid generator to generate an acid. After the irradiation, the heating at 115° C. was further continued for 60 seconds, so as to accelerate the cross-linking reaction.

Thereafter, the small piece with the resist pattern thereon was immersed in a solvent prepared by mixing propylene glycol monoethyl ether (PGME) and ethyl lactate (EL) in a volume ratio of 8:2 for one minute. This solvent was the solvent to be used as solvent for the photoresist.

<Results of Cross-linking Agent Penetration Treatment>

Figure 11A:
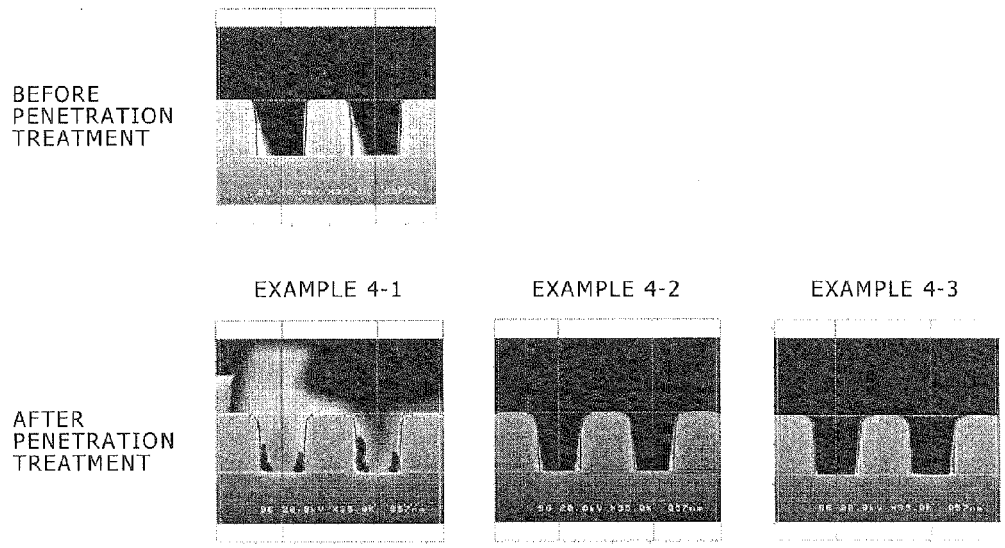
FIG. 11A shows SEM images of a resist pattern section after cross-linking agent penetration treatments according to Examples 4-1 to 4-3 of the present invention.
Figure 11B:
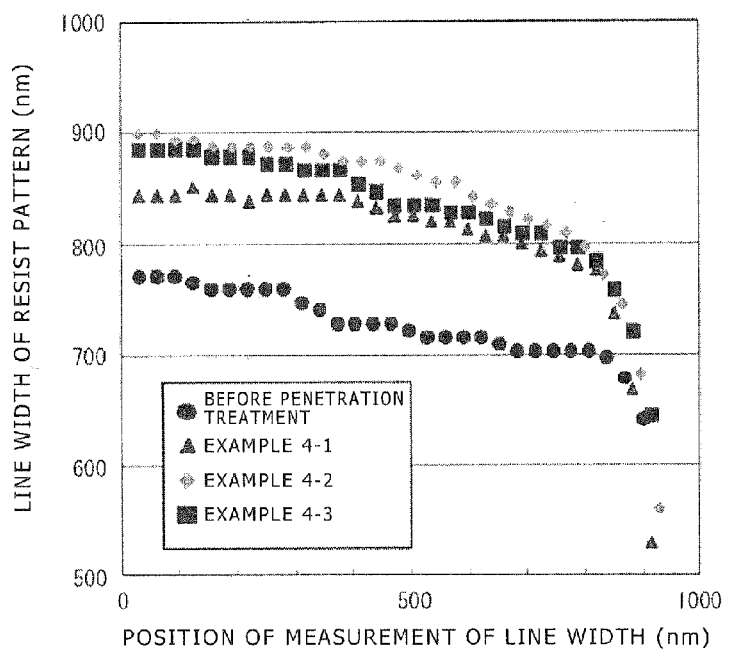
FIG. 11B is a graph showing measurement results of the line widths of line patterns after the treatments.

FIG. 11A shows SEM images of sections of the resist patterns having undergone the cross-linking agent penetration treatments according to Examples 4-1 to 4-3. FIG. 11B is a graph showing the measurement results of the line widths of resist line patterns after the cross-linking agent penetration treatment, obtained by use of the SEM images of the resist pattern sections and an image analysis software. The image analysis software has the function of reading the resist pattern section image, recognizing as an edge a point or line where brightness changes, and measuring the distance between such edges. The axis of ordinates in the graph represents the line width of the line pattern, and the axis of abscissas represents the position (the position in the thickness direction, or the height from the surface of the support) where the line width was measured. It was found that the resist pattern after the penetration treatment shows an increase in line width, as compared with the resist pattern before the penetration treatment, like in Example 1. It is considered that hexakis(methoxymethyl)melamine had penetrated the resist pattern or had been adhered to the resist pattern. In addition, as the proportions of hexakis(methoxymethyl)melamine and ethanol in the aqueous modifier solution were higher, the rate of increase in the line width was higher. This is considered to suggest an increase in the penetration amount of hexakis(methoxymethyl)melamine.

FIGS. 12A to 12E are SEM images of a sections of the resist pattern at each state of the treatment steps in Example 4-4. There is no significant change between the sectional shape after hardening and the sectional shape after immersion in the solvent. It is seen from this result that the resist pattern could be given such a solvent resistance as not to be deformed by or eluted into the resist solvent, by the above-mentioned modifying method.

FIGS. 13A to 13C are SEM images of sections of the resist patterns before and after the solvent resistance test in Examples 4-1 to 4-3. There is no significant change in the sectional shape of the resist pattern between the stage before the solvent resistance test and the stage after the test. It is seen from this result that the resist pattern could be given such a solvent resistance as not to be deformed by or eluted into the resist solvent, by the hardening treatment. Besides, it was found by comparison of the results obtained in Examples 4-1 to 4-3 that as the proportion of hexakis(methoxymethyl) melamine in the aqueous modifier solution is higher, the change in the resist pattern sectional shape by the solvent resistance test is smaller and, hence, the solvent resistance of the resist pattern is higher.

While the present embodiment has been described above based on embodiments and Examples, the invention is not limited to these examples. Naturally, various modifications can be made, as required, within the scope of the invention.

The present application contains subject matter related to that disclosed in Japanese Priority Patent Application JP 2010-077731 filed in the Japan Patent Office on Mar. 30, 2010, the entire content of which is hereby incorporated by reference.

It should be understood by those skilled in the art that various modifications, combinations, sub-combinations and alternations may occur depending on design requirements and other factors insofar as they are within the scope of the appended claims or the equivalent thereof.

What is claimed is:

1. A method of modifying a positive-type chemically amplified resist pattern, the method comprising:
   a step (a) of patterning a photoresist to form a resist pattern on a support, said resist pattern touching said support;
   a step (b) of coating said resist pattern with an aqueous modifier solution, said aqueous modifier solution being from the group consisting of a penetration accelerator and a water-soluble cross-linking agent;
   a step (c) of forming a surface layer portion on a surface of the resist pattern by heating said aqueous modifier solution and said resist pattern at a temperature of not more than 150° C.;
   a step (d) of removing a surplus of the aqueous modifier solution, said surplus of the aqueous modifier solution having not penetrated into said resist pattern in the step (c);

a step (e) of irradiating said surface layer portion and said support with an ultraviolet light, the step (d) being performed before the step (e);

a step (f) of transforming said surface layer portion into a hardened layer by heating said surface layer portion at a temperature of not more than 150° C., the step (e) being performed before or during the step (f), wherein said photoresist comprises a positive-type chemically amplified resist, said photoresist being an admixture of said positive-type chemically amplified resist and said water-soluble cross-linking agent.

2. The method according to claim 1, wherein said aqueous modifier solution includes said penetration accelerator and said water-soluble cross-linking agent.

3. The method according to claim 1, wherein said penetration accelerator is from the group consisting of ethanol and methanol.

4. The method according to claim 1, wherein said aqueous modifier solution includes only said water-soluble cross-linking agent.

5. The method according to claim 1, wherein said water-soluble cross-linking agent is hexakis(methoxymethyl)melamine.

6. The method according to claim 1, wherein said support is a resin support.

7. The method according to claim 1, wherein said support is a wafer.

8. The method according to claim 1, wherein the step (a) is photolithography.

9. The method according to claim 1, wherein the step (a) is an ink jet printing method.

10. The method according to claim 1, wherein after the step (a) and prior to the step (b), the method further comprising:

a step (a-1) of covering said resist pattern with an aqueous solution, said aqueous solution being from the group consisting of ethanol and methanol.

11. The method according to claim 1, wherein said support is rotated during the step (b).

12. The method according to claim 1, wherein said support is rotated during the step (d).

13. The method according to claim 1, wherein the step (e) is performed during the step (f).

14. A method of modifying a positive-type chemically amplified resist pattern, the method comprising:

a step (a) of patterning a photoresist to form a resist pattern on a support, said resist pattern touching said support;

a step (b) of coating said resist pattern with an aqueous modifier solution, said aqueous modifier solution being from the group consisting of a penetration accelerator and a water-soluble cross-linking agent;

a step (c) of forming a surface layer portion on a surface of the resist pattern by heating said aqueous modifier solution and said resist pattern at a temperature of not more than 150° C.;

a step (d) of removing a surplus of the aqueous modifier solution, said surplus of the aqueous modifier solution having not penetrated into said resist pattern in the step (c);

a step (e) of irradiating said surface layer portion and said support with an ultraviolet light, the step (d) being performed before the step (e);

a step (f) of transforming said surface layer portion into a hardened layer by heating said surface layer portion at a temperature of not more than 150° C., the step (e) being performed before or during the step (f), wherein said aqueous modifier solution includes only said penetration accelerator.

15. A method of modifying a positive-type chemically amplified resist pattern, the method comprising:

a step (a) of patterning a photoresist to form a resist pattern on a support, said resist pattern touching said support;

a step (b) of coating said resist pattern with an aqueous modifier solution, said aqueous modifier solution being from the group consisting of a penetration accelerator and a water-soluble cross-linking agent;

a step (c) of forming a surface layer portion on a surface of the resist pattern by heating said aqueous modifier solution and said resist pattern at a temperature of not more than 150° C.;

a step (d) of removing a surplus of the aqueous modifier solution, said surplus of the aqueous modifier solution having not penetrated into said resist pattern in the step (c);

a step (e) of irradiating said surface layer portion and said support with an ultraviolet light, the step (d) being performed before the step (e);

a step (f) of transforming said surface layer portion into a hardened layer by heating said surface layer portion at a temperature of not more than 150° C., the step (e) being performed before or during the step (f), wherein the step (e) is performed before the step (f).

* * * * *